(12) United States Patent
Yamazaki et al.

(10) Patent No.: US 8,809,851 B2
(45) Date of Patent: Aug. 19, 2014

(54) SEMICONDUCTOR DEVICE

(75) Inventors: Shunpei Yamazaki, Tokyo (JP); Kiyoshi Kato, Kanagawa (JP); Yutaka Shionoiri, Kanagawa (JP); Yusuke Sekine, Kanagawa (JP); Kazuma Furutani, Kanagawa (JP); Hiromichi Godo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 362 days.

(21) Appl. No.: 13/101,644

(22) Filed: May 5, 2011

(65) Prior Publication Data

US 2011/0278571 A1    Nov. 17, 2011

(30) Foreign Application Priority Data

May 14, 2010  (JP) ................. 2010-112260

(51) Int. Cl.
*H01L 29/12*    (2006.01)

(52) U.S. Cl.
USPC ........................................ 257/43; 257/296

(58) Field of Classification Search
None
See application file for complete search history.

(56) References Cited

U.S. PATENT DOCUMENTS

| | | | |
|---|---|---|---|
| 4,466,081 A | 8/1984 | Masuoka | |
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |

(Continued)

FOREIGN PATENT DOCUMENTS

| CN | 101226311 A | 7/2008 |
|---|---|---|
| CN | 101258607 A | 9/2008 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Thien F Tran
(74) *Attorney, Agent, or Firm* — Fish & Richardson, P.C.

(57) ABSTRACT

A semiconductor device including a first transistor and a second transistor and a capacitor which are over the first transistor is provided. A semiconductor layer of the second transistor includes an offset region. In the second transistor provided with an offset region, the off-state current of the second transistor can be reduced. Thus, a semiconductor device which can hold data for a long time can be provided.

26 Claims, 20 Drawing Sheets

(56) References Cited

U.S. PATENT DOCUMENTS

| | | |
|---|---|---|
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,935,582 B2 | 5/2011 | Iwasaki |
| 7,956,361 B2 | 6/2011 | Iwasaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0169469 A1 | 7/2008 | Kawamura et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0001259 A1 | 1/2010 | Saitho et al. |
| 2010/0032665 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0140613 A1 | 6/2010 | Kimura |
| 2010/0148171 A1 | 6/2010 | Hayashi et al. |
| 2010/0224878 A1 | 9/2010 | Kimura |
| 2010/0276689 A1 | 11/2010 | Iwasaki |
| 2010/0279462 A1 | 11/2010 | Iwasaki |
| 2011/0193082 A1 | 8/2011 | Iwasaki |

FOREIGN PATENT DOCUMENTS

| | | |
|---|---|---|
| CN | 101645462 A | 2/2010 |
| CN | 101859711 A | 10/2010 |
| EP | 1 737 044 A1 | 12/2006 |
| EP | 1 947 695 A2 | 7/2008 |
| EP | 2 226 847 A2 | 9/2010 |
| EP | 2 339 639 A2 | 6/2011 |
| JP | 56-162875 A | 12/1981 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-093924 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-103918 A | 4/2007 |
| JP | 2008-175842 A | 7/2008 |
| JP | 2010-062548 A | 3/2010 |
| JP | 2010-183108 A | 8/2010 |
| KR | 2008-0053355 A | 6/2008 |
| KR | 2008-0067562 A | 7/2008 |
| KR | 2010-0019379 A | 2/2010 |
| WO | 2004/114391 A1 | 12/2004 |
| WO | 2007/029844 A1 | 3/2007 |
| WO | 2007/148653 A1 | 12/2007 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

(56) References Cited

OTHER PUBLICATIONS

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays,"AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," : SID Digest '08 : SID International Symposium Digest of Technical Papers, 2008, vol. 39, pp. 1277-1280.

Ikeda, T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFe2O4, and YB2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

(56) References Cited

OTHER PUBLICATIONS

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator,"0 Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

International Search Report, PCT Application No. PCT/JP2011/060791, dated Aug. 23, 2011, 4 pages.

Written Opinion, PCT Application No. PCT/JP2011/060791, dated Aug. 23, 2011, 4 pages.

SEMICONDUCTOR DEVICE

TECHNICAL FIELD

The disclosed invention relates to a semiconductor device including a semiconductor element and a manufacturing method thereof.

BACKGROUND ART

Memory devices including semiconductor elements are broadly classified into two categories: a volatile memory device that loses stored data when not powered, and a non-volatile memory device that holds stored data even when not powered.

A typical example of a volatile memory device is a dynamic random access memory (DRAM). A DRAM stores data in such a manner that a transistor included in a memory element is selected and charge is accumulated in a capacitor.

When data is read from a DRAM, charge in a capacitor is lost owing to the above principle; thus, writing is necessary every time data is read out. Moreover, since leakage current (off-state current) flows between a source and a drain of a transistor included in a memory element when the transistor is in an off state, charge flows into or out even when the transistor is not selected, which makes a data holding period short. For that reason, write operation (refresh operation) is necessary at predetermined intervals, and it is difficult to sufficiently reduce power consumption. Furthermore, since stored data is lost when power supply is stopped, another memory device using a magnetic material or an optical material is needed in order to hold data for a long time.

Another example of a volatile memory device is a static random access memory (SRAM). An SRAM holds stored data by using a circuit such as a flip-flop and thus does not need refresh operation, which is an advantage over a DRAM. However, cost per storage capacity is increased because a circuit such as a flip-flop is used. Moreover, as in a DRAM, stored data in an SRAM is lost when power supply is stopped.

A typical example of a non-volatile memory device is a flash memory. A flash memory includes a floating gate between a gate electrode and a channel formation region in a transistor and stores data by holding charge in the floating gate. Therefore, a flash memory has advantages that the data holding period is extremely long (semi-permanent) and refresh operation which is necessary in a volatile memory device is not needed (e.g., see Patent Document 1).

However, in a flash memory, there is a problem in that a memory element becomes unable to function after a predetermined number of writing because a gate insulating layer included in the memory element deteriorates due to tunneling current generated in writing. In order to reduce effects of this problem, a method in which the number of writing is equalized among the memory elements can be employed, for example, but a complicated peripheral circuit is needed to employ this method. Moreover, even when such a method is employed, the fundamental problem about the lifetime is not resolved. In other words, a flash memory is not suitable for applications in which data is frequently rewritten.

In addition, high voltage is needed for injecting charge in the floating gate or removing the charge, and a circuit therefor is required. Further, it takes a relatively long time to inject or remove charge, and it is not easy to increase the speed of writing and erasing data.

REFERENCE

[Patent Document 1] Japanese Published Patent Application No. S57-105889

DISCLOSURE OF INVENTION

In view of the foregoing problems, an object of one embodiment of the disclosed invention is to provide a semiconductor device with a novel structure in which stored data can be held even when power is not supplied and the number of writing is not limited.

In the disclosed invention, a semiconductor device is formed using a purified oxide semiconductor. A transistor formed using a purified oxide semiconductor can hold data for a long time because leakage current thereof is extremely small.

One embodiment of the present invention is a semiconductor device including a plurality of memory cells each including a first transistor, a second transistor, and a capacitor. The first transistor includes a first channel formation region; a first gate insulating layer over the first channel formation region; a first gate electrode over the first gate insulating layer, the first gate electrode overlapping with the first channel formation region; and a first source electrode and a first drain electrode electrically connected to the first channel formation region. The second transistor includes an oxide semiconductor layer including a second channel formation region and an offset region in contact with the second channel formation region; a second source electrode and a second drain electrode which are electrically connected to the oxide semiconductor layer; a second gate electrode overlapping with the second channel formation region; and a second gate insulating layer between the oxide semiconductor layer and the second gate electrode. The first gate electrode, the second source electrode, and one electrode of the capacitor are electrically connected to one another.

One embodiment of the present invention is a semiconductor device including a plurality of memory cells each including a first transistor, a second transistor, and a capacitor. The first transistor includes a first channel formation region; a first gate insulating layer over the first channel formation region; a first gate electrode over the first gate insulating layer, the first gate electrode overlapping with the first channel formation region; and a first source electrode and a first drain electrode electrically connected to the first channel formation region. The second transistor includes a second source electrode and a second drain electrode; an oxide semiconductor layer over the second source electrode and the second drain electrode, the oxide semiconductor layer including a second channel formation region and an offset region in contact with the second channel formation region; a second gate insulating layer over the oxide semiconductor layer; and a second gate electrode over the second gate insulating layer, the second gate electrode overlapping with the second channel formation region. The first gate electrode, the second source electrode, and one electrode of the capacitor are electrically connected to one another. The first transistor and the second transistor overlap with each other at least partly.

One embodiment of the present invention is a semiconductor device including a plurality of memory cells each including a first transistor, a second transistor, and a capacitor. The first transistor includes a first channel formation region; a first gate insulating layer over the first channel formation region; a first gate electrode over the first gate insulating layer, the first gate electrode overlapping with the first channel formation region; and a first source electrode and a first drain electrode electrically connected to the first channel formation region. The second transistor includes an oxide semiconductor layer including a second channel formation region and an offset region in contact with the second channel formation region; a second source electrode and a second drain electrode over the oxide semiconductor layer; a second gate insulating layer covering the second source electrode, the second drain electrode, and the oxide semiconductor layer; and a second gate electrode over the second gate insulating layer, the second gate electrode overlapping with the second channel formation region. The first gate electrode, the second source electrode, and one electrode of the capacitor are electrically connected to one another. The first transistor and the second transistor overlap with each other at least partly.

In the above semiconductor device, the first channel formation region preferably includes silicon.

In the above semiconductor device, the second transistor may be a multi-gate transistor.

Note that in this specification and the like, an offset region refers to a region in a semiconductor layer which is between a region overlapping with a gate electrode (a channel formation region) and a region overlapping with a source electrode or a drain electrode. In other words, the offset region is a region in a semiconductor layer which overlaps with neither a source electrode, a drain electrode, nor a gate electrode. The offset region serves as a resistance region. Therefore, by providing an offset region in a semiconductor layer, the off-state current of the transistor can be reduced.

Note that in this specification and the like, the term such as "over" and "below" does not necessarily mean that a component is placed "directly over" and "directly below" another component. For example, the expression "a gate electrode over a gate insulating layer" does not exclude the case where a component is provided between the gate insulating layer and the gate electrode.

In addition, in this specification and the like, the term such as "electrode" or "wiring" does not limit a function of a component. For example, an "electrode" is sometimes used as part of a "wiring", and vice versa. Further, the term "electrode" or "wiring" can include the case where a plurality of "electrodes" or "wirings" are formed in an integrated manner.

Further, functions of a "source" and a "drain" are sometimes interchanged with each other when a transistor of opposite polarity is used or when the direction of current flow is changed in circuit operation, for example. Therefore, the terms "source" and "drain" can be interchanged in this specification.

Note that in this specification and the like, the term "electrically connected" includes the case where components are connected through an object having any electric function. There is no particular limitation on the object having any electric function as long as electric signals can be transmitted and received between the components that are connected through the object. Examples of the object having any electric function include a switching element such as a transistor, a resistor, an inductor, a capacitor, and an element with a variety of functions as well as an electrode and a wiring.

A transistor including an oxide semiconductor has a small off-state current. When an offset region is formed in the oxide semiconductor layer, the transistor can have an even smaller off-state current. Consequently, with this transistor, stored data can be held for an extremely long time. In other words, refresh operation becomes unnecessary or the frequency of the refresh operation can be extremely low, which leads to a sufficient reduction in power consumption. Moreover, stored data can be stored for a long time even while power is not supplied.

Further, a semiconductor device according to one embodiment of the present invention does not need high voltage for writing data, and degradation of the element does not become a problem. For example, unlike a conventional non-volatile memory, it is not necessary to inject and extract electrons into and from a floating gate; thus, a problem such as degradation of a gate insulating layer does not occur at all. That is, the semiconductor device according to one embodiment of the present invention does not have a limit on the number of rewriting, which has been a problem of a conventional non-volatile memory, and thus has significantly improved reliability. Furthermore, since data is written by turning on or off the transistor, high-speed operation can be easily realized. Additionally, there is an advantage that operation for erasing data is not needed.

Further, in combination with a transistor which includes a material other than an oxide semiconductor and which can operate at sufficiently high speed and a transistor including an oxide semiconductor, a semiconductor device can perform operation (e.g., reading data) at sufficiently high speed. Further, with a transistor including a material other than an oxide semiconductor, a variety of circuits (e.g., a logic circuit or a driver circuit) which needs to operate at high speed can be suitably realized.

Thus, a semiconductor device having a novel feature can be realized by provision of both the transistor including a material other than an oxide semiconductor (a transistor capable of operation at sufficiently high speed) and the transistor including an oxide semiconductor (and more broadly, a transistor whose off-state current is sufficiently small).

BEST MODE FOR CARRYING OUT THE INVENTION

Figure 1A:
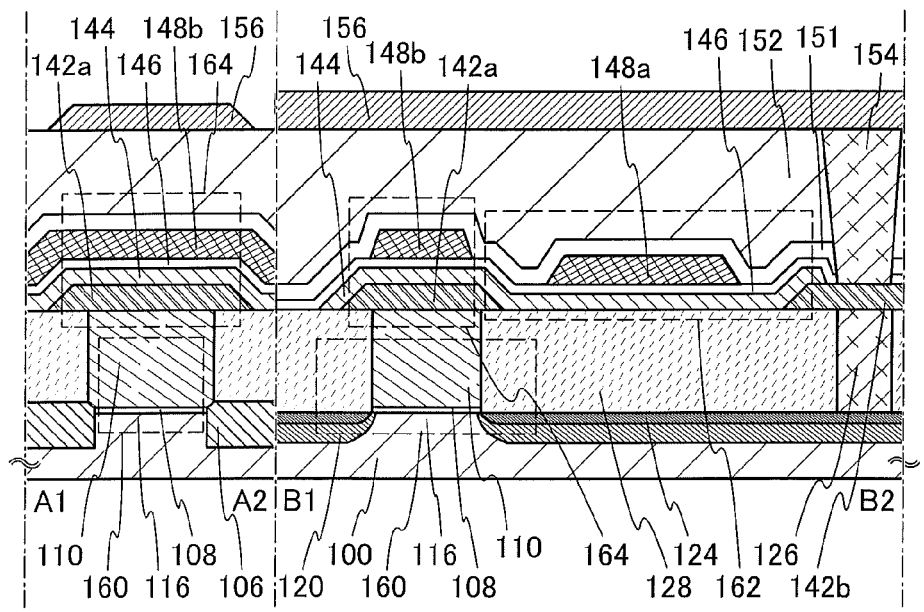
FIGS. 1A and 1B are a cross-sectional view and a plan view of a semiconductor device.

Hereinafter, embodiments and examples of the present invention are described with reference to the drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description in the following embodiments and examples. Note that in the following embodiments and examples, like portions or portions having like functions in different drawings are denoted by the like reference numerals and repeated description thereof is omitted.

Note that the position, the size, the range, or the like of each structure illustrated in drawings and the like is not accurately represented in some cases for easy understanding. The disclosed invention is thus not necessarily limited by the position, size, range, or the like illustrated in the drawings and the like.

In this specification and the like, ordinal numbers such as first, second, and third are used in order to avoid confusion among components, and the terms do not limit the components numerically.

(Embodiment 1)

In this embodiment, a structure and a method for manufacturing a semiconductor device according to one embodiment of the present invention will be described with reference to FIGS. 1A and 1B, FIGS. 2A to 2D, FIGS. 3A to 3D, FIGS. 4A to 4C, FIGS. 5A to 5C, and FIGS. 6A and 6B.

<Cross-sectional Structure and Planar Structure of Semiconductor Device>

Figure 1B:
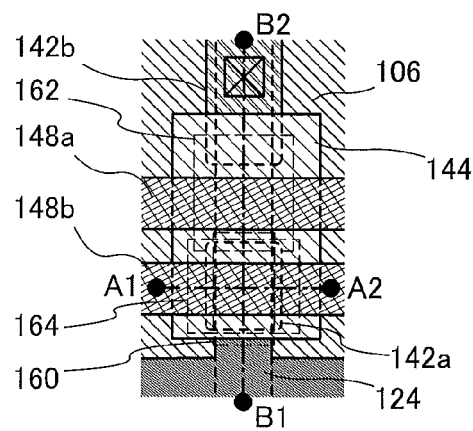

FIGS. 1A and 1B illustrate an example of a structure of a semiconductor device. FIG. 1A is a cross-sectional view of the semiconductor device, and FIG. 1B is a plan view of the semiconductor device. Here, FIG. 1A illustrates a cross section taken along line A1-A2 and line B1-B2 in FIG. 1B. The semiconductor device illustrated in FIGS. 1A and 1B includes a transistor 160 including a first semiconductor material in a lower portion, and a transistor 162 including a second semiconductor material in an upper portion. Here, it is preferable that the first semiconductor material and the second semiconductor material be different from each other. For example, the first semiconductor material can be a semiconductor material other than an oxide semiconductor and the second semiconductor material can be an oxide semiconductor. The semiconductor material other than an oxide semiconductor can be, for example, silicon, germanium, silicon germanium, silicon carbide, indium phosphide, or gallium arsenide, and a single crystal semiconductor is preferably used. A transistor including such a semiconductor material can easily operate at high speed. On the other hand, a transistor including an oxide semiconductor can hold charge for a long time owing to its characteristics.

Although both of the transistors are n-channel transistors in this description, it should be appreciated that p-channel transistors can be used. Since the technical essence of the disclosed invention lies in the use of a semiconductor material which can sufficiently reduce an off-state current, such as an oxide semiconductor, for the transistor 162 in order to hold data, it is not necessary to limit specific conditions such as a material, a structure, or the like of the semiconductor device to those given here.

The transistor 160 in FIGS. 1A and 1B includes a channel formation region 116 provided in a substrate 100 including a semiconductor material (e.g., silicon), impurity regions 120 provided so that the channel formation region 116 is sandwiched therebetween, metal compound regions 124 in contact with the impurity regions 120, a gate insulating layer 108 provided over the channel formation region 116, and a gate electrode 110 provided over the gate insulating layer 108. Note that a transistor whose source electrode and drain electrode are not illustrated in a drawing may be referred to as a transistor for the sake of convenience. Further, in such a case, in description of a connection of a transistor, a source region and a source electrode may be collectively referred to as a source electrode, and a drain region and a drain electrode may be collectively referred to as a drain electrode. That is, in this specification, the term "source electrode" may include a source region.

An electrode 126 is connected to part of the metal compound region 124 of the transistor 160. Here, the electrode 126 serves as a source electrode or a drain electrode of the transistor 160. Further, the substrate 100 is provided with an element isolation insulating layer 106 which surrounds the transistor 160. An insulating layer 128 is provided over the metal compound region 124. Note that in order to realize higher integration, it is preferable that the transistor 160 do not include a sidewall insulating layer as illustrated in FIGS. 1A and 1B. On the other hand, when the characteristics of the transistor 160 have priority, the sidewall insulating layer may be formed on a side surface of the gate electrode 110 and the impurity region 120 may include a region having a different impurity concentration of a region overlapping with the sidewall insulating layer.

The transistor 162 in FIGS. 1A and 1B includes a source electrode (or a drain electrode) 142a and a drain electrode (or a source electrode) 142b over the insulating layer 128, an oxide semiconductor layer 144 electrically connected to the source electrode 142a and the drain electrode 142b, a gate insulating layer 146 covering the source electrode 142a, the drain electrode 142b, and the oxide semiconductor layer 144, and a gate electrode 148a which is over the gate insulating layer 146 to overlap with part of the oxide semiconductor layer 144.

The oxide semiconductor layer 144 includes a channel formation region which overlaps with the gate electrode 148a and an offset region which is in contact with the channel formation region. In the oxide semiconductor layer 144, the offset region is a region which overlaps with neither the source electrode 142a, the drain electrode 142b, nor the gate electrode 148a.

Here, it is preferable that the oxide semiconductor layer 144 be purified by sufficient removal of impurities such as hydrogen and/or sufficient supply of oxygen. Specifically, the hydrogen concentration of the oxide semiconductor layer 144 is lower than or equal to $5\times10^{19}$ atoms/cm$^3$, preferably lower than or equal to $5\times10^{18}$ atoms/cm$^3$, more preferably lower than or equal to $5\times10^{17}$ atoms/cm$^3$, for example. Note that the above hydrogen concentration of the oxide semiconductor layer 144 is measured by secondary ion mass spectroscopy (SIMS). Thus, in the oxide semiconductor layer 144 in which the hydrogen concentration is sufficiently reduced so that the oxide semiconductor layer is purified and in which defect levels in the energy gap due to oxygen defects are reduced by sufficient supply of oxygen, the concentration of carriers which derived from donors and acceptors is lower than $1\times10^{12}/cm^3$, preferably lower than $1\times10^{11}/cm^3$, more preferably lower than $1.45\times10^{10}/cm^3$. In this manner, by using an oxide semiconductor which is made to be an i-type (intrinsic) oxide semiconductor or a substantially i-type oxide semiconductor, the transistor 162 which has significantly excellent off-state current characteristics can be obtained.

A capacitor 164 in FIGS. 1A and 1B includes the source electrode 142a, the oxide semiconductor layer 144, the gate insulating layer 146, and an electrode 148b. In other words, the source electrode 142a serves as one electrode of the capacitor 164 and the electrode 148b serves as the other electrode of the capacitor 164.

In the capacitor 164 in FIGS. 1A and 1B, the oxide semiconductor layer 144 and the gate insulating layer 146 are stacked, whereby insulation between the source electrode 142a and the electrode 148b can be sufficiently ensured. Note that the oxide semiconductor layer 144 in the capacitor 164 may be omitted.

In this embodiment, the transistor 160 and the transistor 162 are provided to overlap with each other at least partly. In addition, the capacitor 164 is provided to overlap with the transistor 160. For example, the electrode 148b of the capacitor 164 is provided to overlap with at least part of the gate electrode 110 of the transistor 160. Such a planar layout allows higher integration.

Note that in the transistor 162 and the capacitor 164, the source electrode 142a and the drain electrode 142b preferably have tapered end portion. When the end portions of the source electrode 142a and the drain electrode 142b are tapered, the coverage with the oxide semiconductor layer 144 can be improved and a break thereof due to a step can be prevented. Here, the taper angle is greater than or equal to 30° and less than or equal to 60°, for example. Note that the taper angle refers to an angle formed between the side surface and the bottom surface of a layer having a tapered shape (e.g., the source electrode 142a) when the layer is seen in a direction perpendicular to a cross-sectional plane (i.e., the plane perpendicular to the surface of a substrate).

An insulating layer 151 is provided over the transistor 162 and the capacitor 164, and an insulating layer 152 is provided over the insulating layer 151. An electrode 154 is provided in an opening formed in the gate insulating layer 146, the insulating layer 151, the insulating layer 152, and the like, and a wiring 156 is formed over the insulating layer 152 to be connected to the electrode 154. The wiring 156 electrically connects one memory cell to another memory cell. Note that although the metal compound region 124, the drain electrode 142b, and the wiring 156 are connected to one another through the electrode 126 and the electrode 154 in FIGS. 1A and 1B, the disclosed invention is not limited thereto. For example, the drain electrode 142b may be in direct contact with the metal compound region 124, or the wiring 156 may be in direct contact with the drain electrode 142b.

Note that in FIGS. 1A and 1B, the electrode 126 for connecting the metal compound region 124 to the drain electrode 142b and the electrode 154 for connecting the drain electrode 142b to the wiring 156 overlap with each other. In other words, a region in which the electrode 126 serving as a source electrode or a drain electrode of the transistor 160 is in contact with the drain electrode 142b of the transistor 162 overlaps with a region in which the drain electrode 142b of the transistor 162 is in contact with the electrode 154. Such a layout allows higher integration.

<Method for Manufacturing Semiconductor Device>

Next, an example of a method for manufacturing the semiconductor device will be described. First, a method for manufacturing the transistor 160 in the lower portion will be described below with reference to FIGS. 2A to 2D and FIGS. 3A to 3D, and then a method for manufacturing the transistor 162 in the upper portion and the capacitor 164 will be described with reference to FIGS. 4A to 4C and FIGS. 5A to 5C.

<Method for Manufacturing Transistor in Lower Portion>

Figure 2A:
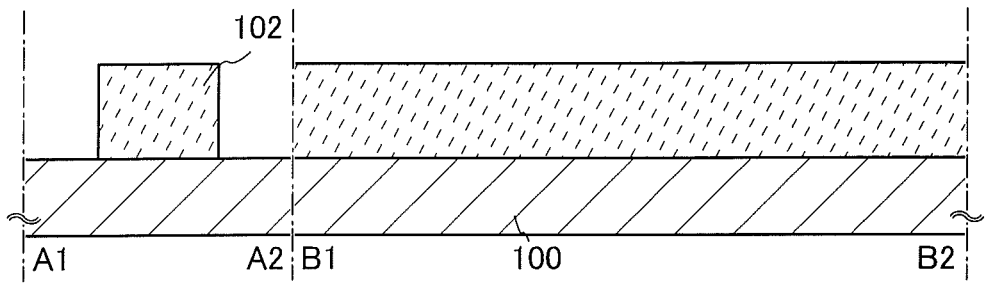
FIGS. 2A to 2D are cross-sectional views of a manufacturing process of a semiconductor device.
Figure 2B:
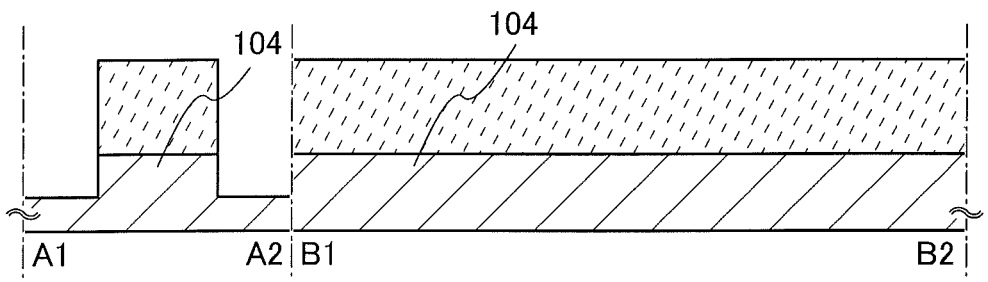

First, the substrate 100 including a semiconductor material is prepared (see FIG. 2A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example where a single crystal silicon substrate is used as the substrate 100 including a semiconductor material is described. Note that although the term "SOI substrate" generally means a substrate in which a silicon semiconductor layer is provided on an insulating surface, the term "SOI substrate" in this specification and the like also includes a substrate in which a semiconductor layer including a material other than silicon is provided on an insulating surface. That is, the semiconductor layer included in the "SOI substrate" is not limited to a silicon semiconductor layer. Moreover, the SOI substrate also includes a substrate having a structure where a semiconductor layer is provided over an insulating substrate such as a glass substrate with an insulating layer interposed therebetween.

Note that it is particularly preferable that a single crystal semiconductor substrate made of silicon or the like be used as the substrate 100 including a semiconductor material because the speed of read operation of the semiconductor device can be increased.

A protective layer 102 serving as a mask for forming an element isolation insulating layer is formed over the substrate 100 (see FIG. 2A). As the protective layer 102, an insulating layer formed using a material such as silicon oxide, silicon nitride, or silicon oxynitride can be used, for example. Note that before or after this step, an impurity element imparting n-type conductivity or p-type conductivity may be added to the substrate 100 in order to control the threshold voltage of the transistor. When the semiconductor material included in the substrate 100 is silicon, phosphorus, arsenic, or the like can be used as the impurity imparting n-type conductivity, and boron, aluminum, gallium, or the like can be used as the impurity imparting p-type conductivity.

Then, part of the substrate 100 in a region that is not covered with the protective layer 102 (i.e., an exposed region) is removed by etching using the protective layer 102 as a mask. Thus, a semiconductor region 104 isolated from the other semiconductor regions is formed (see FIG. 2B). As the etching, dry etching is preferably performed, but wet etching may be performed. An etching gas and an etchant can be selected as appropriate in accordance with a material to be etched.

Figure 2C:
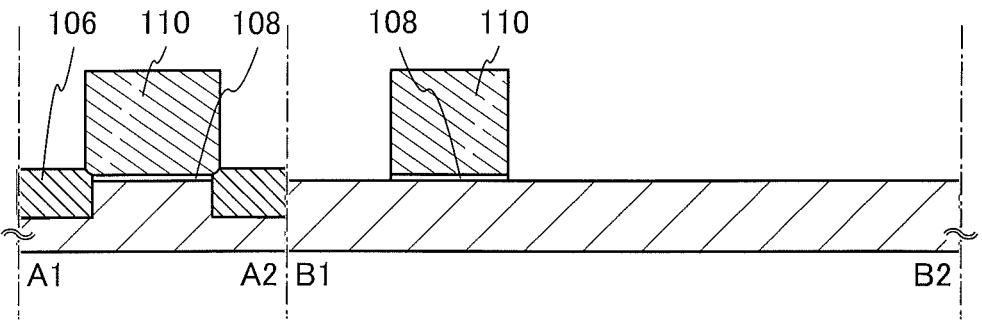

Then, an insulating layer is formed to cover the semiconductor region 104, and a region of the insulating layer which overlaps with the semiconductor region 104 is selectively removed, whereby the element isolation insulating layer 106 is formed (see FIG. 2C). The insulating layer is formed using silicon oxide, silicon nitride, silicon oxynitride, or the like. For removing the insulating layer, any of etching treatment, polishing treatment such as chemical mechanical polishing (CMP), and the like can be employed. Note that the protective layer 102 is removed after the formation of the semiconductor region 104 or after the formation of the element isolation insulating layers 106.

The CMP treatment is a method for planarizing a surface of an object to be processed by a combination of chemical and mechanical actions. More specifically, the CMP treatment is a method in which a polishing cloth is attached to a polishing stage, the polishing stage and an object are each rotated or oscillated while a slurry (an abrasive) is supplied between the object and the polishing cloth, so that the surface of the object is polished by a chemical reaction between the slurry and the surface of the object and by a mechanical polishing action between the polishing cloth and the surface of the object.

Note that the element isolation insulating layer 106 may be formed by, instead of selectively removing an insulating layer, implanting oxygen to form an insulating region, for example.

Then, an insulating layer is formed on a surface of the semiconductor region 104, and a layer including a conductive material is formed over the insulating layer.

The insulating layer is to be a gate insulating layer later and can be formed by heat treatment (e.g., thermal oxidation treatment or thermal nitridation treatment) on the surface of the semiconductor region 104, for example. High-density plasma treatment may be employed instead of heat treatment. The high-density plasma treatment can be performed using, for example, a mixed gas of any of a rare gas such as He, Ar, Kr, or Xe, oxygen, nitrogen oxide, ammonia, nitrogen, hydrogen, and the like. Needless to say, the insulating layer may be formed by a CVD method, a sputtering method, or the like. The insulating layer preferably has a single-layer structure or a stacked-layer structure which includes film including silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, and the like. The insulating layer can have a thickness of for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. Further, the layer including a conductive material may be formed using a semiconductor material such as polycrystalline silicon. There is no particular limitation on the method for forming the layer including a conductive material, and any of a variety of film formation methods such as an evaporation method, a CVD method, a sputtering method, and a spin coating method can be employed. Note that in an example described in this embodiment, the layer including a conductive material is formed using a metal material.

After that, the insulating layer and the layer including a conductive material are selectively etched, whereby the gate insulating layer 108 and the gate electrode 110 are formed (see FIG. 2C).

Figure 2D:
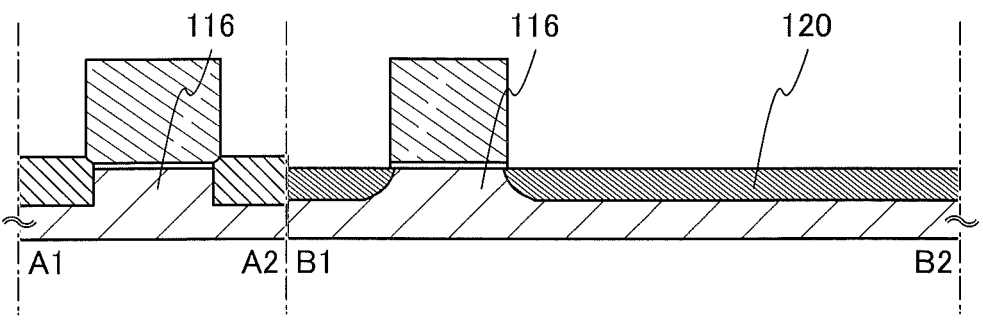

Then, phosphorus (P), arsenic (As), or the like is added to the semiconductor region 104, whereby the channel formation region 116 and the impurity region 120 are formed (see FIG. 2D). Note that phosphorus or arsenic is added here in order to form an n-channel transistor; an impurity element such as boron (B) or aluminum (Al) may be added in the case of forming a p-channel transistor. Here, the concentration of the impurity added can be set as appropriate; the concentration is preferably set high when a semiconductor element is highly miniaturized.

Note that a sidewall insulating layer may be formed around the gate electrode 110 and an impurity region to which an impurity element is added at a different concentration may be formed.

Figure 3A:
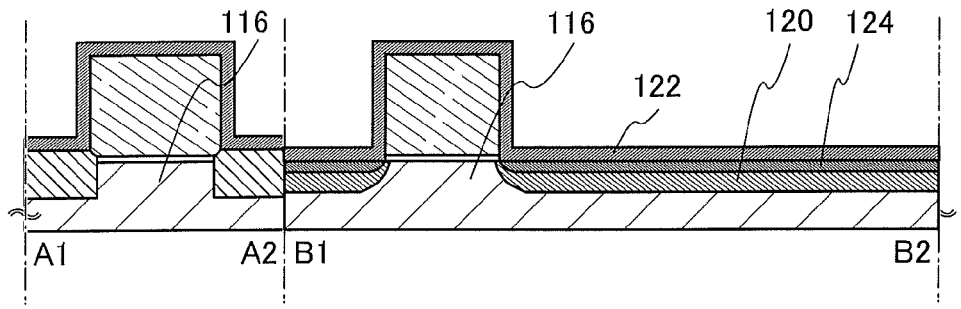
FIGS. 3A to 3D are cross-sectional views of a manufacturing process of a semiconductor device.

Then, a metal layer 122 is formed to cover the gate electrode 110, the impurity region 120, and the like (see FIG. 3A). The metal layer 122 can be formed by any of a variety of film formation methods such as a vacuum evaporation method, a sputtering method, and a spin coating method. It is preferable that the metal layer 122 be formed using a metal material that reacts with a semiconductor material included in the semiconductor region 104 to form a low-resistance metal compound. Examples of such a metal material include titanium, tantalum, tungsten, nickel, cobalt, and platinum.

Then, heat treatment is performed so that the metal layer 122 reacts with the semiconductor material included in the semiconductor region 104. Thus, the metal compound regions 124 that are in contact with the impurity regions 120 are formed (see FIG. 3A). Note that when the gate electrode 110 is formed using polycrystalline silicon or the like, a metal compound region is also formed in a portion of the gate electrode 110 which is in contact with the metal layer 122.

As the heat treatment, irradiation with a flash lamp can be employed, for example. Although it should be appreciated that another heat treatment method may be used, a method by which the heat treatment can be achieved in an extremely short time is preferably used in order to improve the control of chemical reaction in formation of the metal compound. Note that the metal compound regions are formed by reaction of the metal material and the semiconductor material and have sufficiently high conductivity. The formation of the metal compound regions can sufficiently reduce the electric resistance and improve element characteristics. Note that the metal layer 122 is removed after the metal compound regions 124 are formed.

Figure 3B:
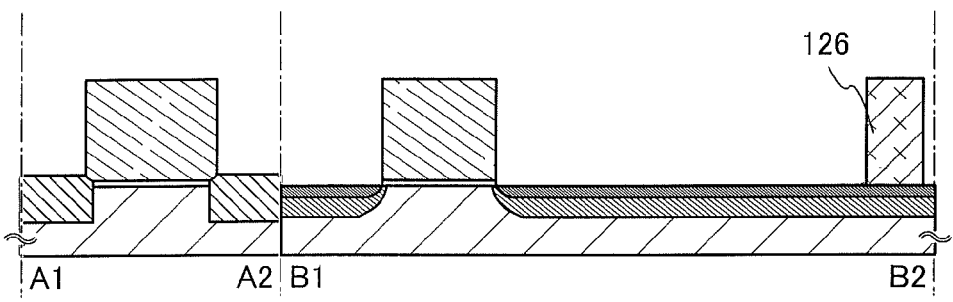

Then, the electrode 126 is formed in a region in contact with part of the metal compound region 124 (see FIG. 3B). The electrode 126 is formed by, for example, forming a layer including a conductive material and then selectively etching the layer. The layer including a conductive material can be formed using a metal material such as aluminum, copper, titanium, tantalum, or tungsten. Further, the layer including a conductive material may be formed using a semiconductor material such as polycrystalline silicon. There is no particular limitation on the method for forming the layer including a conductive material, and any of a variety of film formation methods such as an evaporation method, a CVD method, a sputtering method, and a spin coating method can be employed.

Figure 3C:
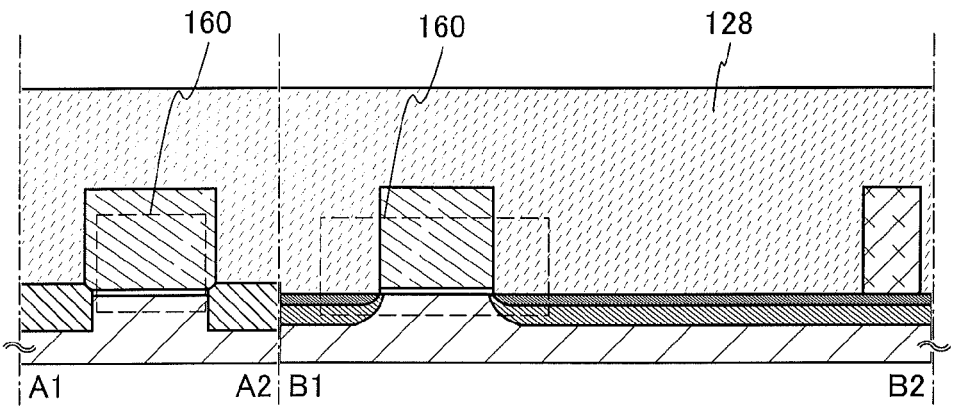

Then, the insulating layer 128 is formed to cover the components formed in the above steps (see FIG. 3C). The insulating layer 128 can be formed using a material including an inorganic insulating material such as silicon oxide, silicon oxynitride, silicon nitride, or aluminum oxide. It is particularly preferable to use a low dielectric constant (low-k) material for the insulating layer 128 because capacitance due to overlap of electrodes or wirings can be sufficiently reduced. Note that the insulating layer 128 may be a porous insulating layer formed using any of those materials. The porous insulating layer has a lower dielectric constant than a dense insulating layer, and thus allows a further reduction in capacitance generated by electrodes or wirings. Further, the insulating layer 128 can be formed using an organic insulating material such as a polyimide or an acrylic resin. Note that although the insulating layer 128 has a single-layer structure of here, one embodiment of the disclosed invention is not limited to this. The insulating layer may have a stacked-layer structure including two or more layers.

Alternatively, the electrode 126 can be formed by forming an opening reaching the metal compound region 124 in the insulating layer 128 after the formation of the insulating layer 128 and then by filling the opening.

In such a case, for example, it is possible to employ a method in which a thin titanium film is formed by a PVD method and a thin titanium nitride film is formed by a CVD method in a region including the opening, and then a tungsten film is formed so as to fill the opening. Here, the titanium film formed by a PVD method has a function of reducing an oxide film (such as a native oxide film) over which the titanium film is to be formed, and thereby lowering contact resistance with the underlying electrode or the like (the metal compound region 124, here). The titanium nitride film formed after the formation of the titanium film has a barrier function of preventing diffusion of the conductive material. A copper film may be formed by a plating method after the formation of the barrier film of titanium, titanium nitride, or the like.

Through the above steps, the transistor 160 is formed using the substrate 100 including a semiconductor material (see FIG. 3C). Such a transistor 160 is capable of high speed operation. By using this transistor as a read transistor, data can be read out at high speed.

Figure 3D:
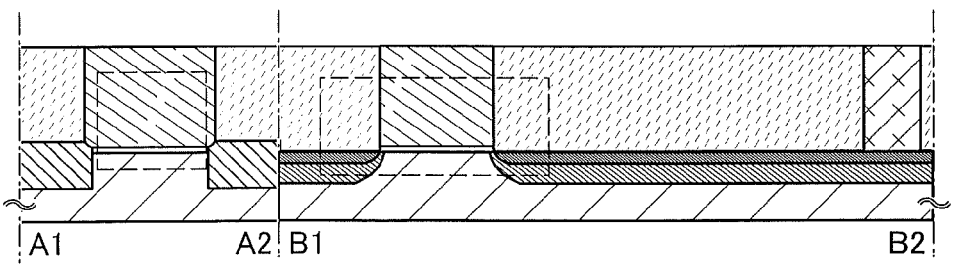

After that, as a treatment before the formation of the transistor 162 and the capacitor 164, CMP treatment is performed on the insulating layer 128 to expose upper surfaces of the gate electrode 110 and the electrode 126 (see FIG. 3D). As treatment for exposing the upper surfaces of the gate electrode 110 and the electrode 126, etching treatment or the like can also be employed as well as CMP treatment; in order to improve characteristics of the transistor 162, the surface of the insulating layer 128 is preferably made as flat as possible.

Note that before or after each of the above steps, a step of forming an electrode, a wiring, a semiconductor layer, an insulating layer, or the like may be further performed. For example, the wiring may have a multi-layer structure including a stack of an insulating layer and a conductive layer to provide a highly integrated semiconductor device.

<Method for Manufacturing Transistor in Upper Portion>

Figure 4A:
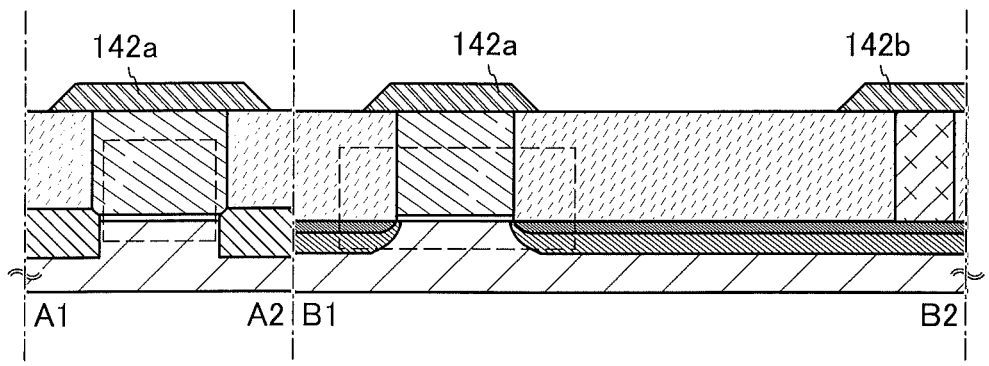
FIGS. 4A to 4C are cross-sectional views of a manufacturing process of a semiconductor device.

Then, a conductive layer is formed over the gate electrode 110, the electrode 126, the insulating layer 128, and the like, and is selectively etched, whereby the source electrode 142a and the drain electrode 142b are formed (see FIG. 4A).

The conductive layer can be formed by a PVD method such as a sputtering method, or a CVD method such as a plasma CVD method. As a material for the conductive layer, an element selected from aluminum, chromium, copper, tantalum, titanium, molybdenum, and tungsten; an alloy including any of these elements as a component; or the like can be used. A material including one of manganese, magnesium, zirconium, beryllium, neodymium, and scandium or a combination of a plurality of these elements may be used.

The conductive layer may have a single-layer structure or a stacked-layer structure including two or more layers. For example, the conductive layer may have a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked. Note that in the case where the conductive layer has a single-layer structure of a titanium film or a titanium nitride film, there is an advantage that the conductive layer is easily processed into the source electrode 142a and the drain electrode 142b having a tapered shape.

The conductive layer may be formed using conductive metal oxide. As the conductive metal oxide, indium oxide, tin oxide, zinc oxide, an indium oxide-tin oxide compound (abbreviated to ITO), an indium oxide-zinc oxide compound, or any of these metal oxide materials which include silicon or silicon oxide can be used.

The conductive layer is preferably etched so that the source electrode 142a and the drain electrode 142b have tapered end portions. Here, the taper angle is preferably greater than or equal to 30° and less than or equal to 60°, for example. When the source electrode 142a and the drain electrode 142b are etched to have tapered end portions, the coverage with the oxide semiconductor layer 144 and the gate insulating layer 146 which are formed later can be improved and a break thereof due to a step can be prevented.

The channel length (L) of the transistor in the upper portion is determined by the width of the gate electrode 148a in the channel length direction (the direction of carrier flow). Further, the width of the offset region in the channel length direction (the offset width) is determined by the distance between the lower ends of the source electrode 142a and the drain electrode 142b and the width of the gate electrode 148a in the channel length direction. Note that in light exposure for forming a mask for a transistor in which the distance between the lower ends of the source electrode 142a and the drain electrode 142b is less than 25 nm, it is preferable to use extreme ultraviolet rays whose wavelength is as short as several nanometers to several tens of nanometers. In the light exposure by extreme ultraviolet light, the resolution is high and the focus depth is large. Thus, the channel length L of the transistor formed later can be reduced, whereby the operation speed of a circuit can be increased. Moreover, miniaturization can lead to lower power consumption of a semiconductor device.

Note that an insulating layer serving as a base may be provided over the interlayer insulating layer 128. The insulating layer can be formed by a PVD method, a CVD method, or the like.

Figure 4B:
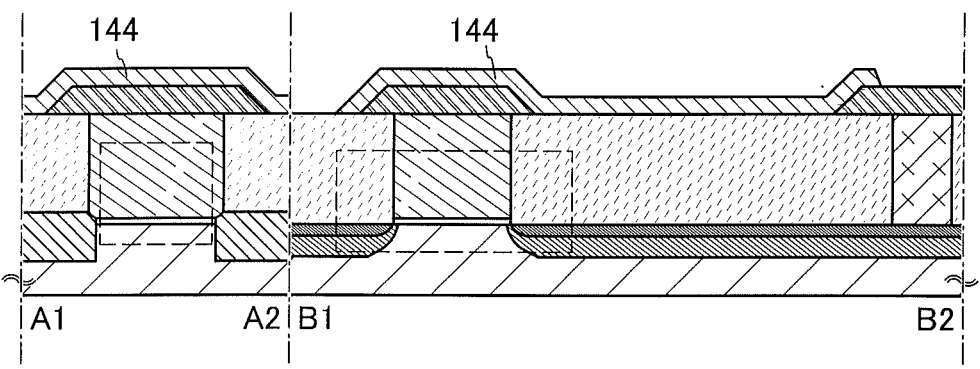
Figure 4C:
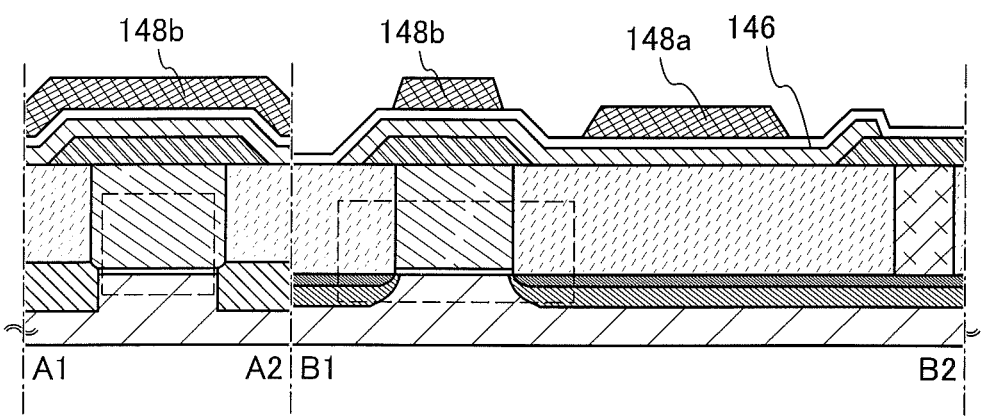

Then, the oxide semiconductor layer 144 is formed by forming an oxide semiconductor layer to cover the source electrode 142a and the drain electrode 142b and then by selectively etching the oxide semiconductor layer (see FIG. 4B).

The oxide semiconductor layer includes at least one element selected from In, Ga, Sn, and Zn. For example, the oxide semiconductor layer can be formed using a four-component metal oxide such as In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, an In—Ga—O-based oxide semiconductor, a Sn—Zn—O-based oxide semiconductor, an Al—Zn—O-based oxide semiconductor, a Zn—Mg-0-based oxide semiconductor, a Sn—Mg—O-based oxide semiconductor, or an In—Mg—O-based oxide semiconductor, an In—O-based oxide semiconductor, a Sn—O-based oxide semiconductor, a Zn—O-based oxide semiconductor, or the like. In addition, any of the above oxide semiconductors may include an element other than In, Ga, Sn, and Zn, for example, $SiO_2$.

In particular, an In—Ga—Zn—O-based oxide semiconductor material has sufficiently high resistance when there is no electric field and the off-state current can be sufficiently reduced. In addition, the In—Ga—Zn—O-based oxide semiconductor material has high field-effect mobility and thus is suitable as a semiconductor material used for a semiconductor device.

As a typical example of the In—Ga—Zn—O-based oxide semiconductor material, the one represented by $InGaO_3(ZnO)_m$ (m>0) is given. In addition, an oxide semiconductor material in which Ga is replaced by M and which is represented by $InMO_3(ZnO)_m$ (m>0) can also be given. Here, M denotes one or more metal elements selected from gallium (Ga), aluminum (Al), iron (Fe), nickel (Ni), manganese (Mn), cobalt (Co), and the like. For example, M can be Ga, Ga and Al, Ga and Fe, Ga and Ni, Ga and Mn, Ga and Co, or the like. Note that the above compositions are merely examples given in accordance with a crystal structure.

When an In—Zn—O-based material is used for the oxide semiconductor layer, a target for depositing the oxide semiconductor layer by a sputtering method has an atomic ratio: In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), more preferably In:Zn=15:1 to 1.5:1 ($In_2O_3$:ZnO=15:2 to 3:4 to in a molar ratio). For example, the target used for depositing an In—Zn—O-based oxide semiconductor has an atomic ratio of Z>1.5X+Y where In:Zn:O=X:Y:Z.

In this embodiment, an oxide semiconductor layer having an amorphous structure is formed by a sputtering method using an In—Ga—Zn—O-based target.

The relative density of the metal oxide in the target is 80% or higher, preferably 95% or higher, more preferably 99.9% or higher. With the use of a target with high relative density, the oxide semiconductor layer can be formed to have a dense structure.

The atmosphere in which the oxide semiconductor layer is formed is preferably a rare gas (typically argon) atmosphere, an oxygen atmosphere, or a mixed atmosphere including a rare gas (typically argon) and oxygen. Specifically, it is preferable to use a high-purity gas atmosphere, for example, from which impurities such as hydrogen, water, hydroxyl, or hydride are removed so that the concentration thereof is reduced to 1 ppm or less (preferably to 10 ppb or less).

In the formation of the oxide semiconductor layer, for example, an object to be processed is held in a process chamber that is kept under reduced pressure and the object is heated to a temperature higher than or equal to 100° C. and lower than 550° C., preferably higher than or equal to 200° C. and lower than or equal to 400° C. Alternatively, the temperature of the object in the formation of the oxide semiconductor layer may be room temperature (25° C.±10° C.). While moisture in the process chamber is removed, a sputtering gas from which hydrogen, water, and the like are removed is introduced, and the above target is used; thus, the oxide semiconductor layer is formed. The oxide semiconductor layer is formed while the object is heated, whereby impurities in the oxide semiconductor layer can be reduced. In addition, damage due to sputtering can be reduced. In order to remove moisture in the process chamber, an entrapment vacuum pump is preferably used. For example, a cryopump, an ion pump, or a titanium sublimation pump can be used. Further, a turbo pump provided with a cold trap may be used. By evacuation with a cryopump or the like, hydrogen, water, and the like can be removed from the process chamber, whereby the impurity concentration of the oxide semiconductor layer can be reduced.

The oxide semiconductor layer can be formed under the following conditions, for example: the distance between the object and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere including oxygen and argon. Note that a pulsed direct current (DC) power source is preferable because dust (powdery substances or the like formed at the time of film formation) can be reduced and the film thickness can be uniform. The thickness of the oxide semiconductor layer is greater than or equal to 1 nm and less than or equal to 50 nm, preferably greater than or equal to 1 nm and less than or equal to 30 nm, more preferably greater than or equal to 1 nm and less than or equal to 10 nm. The use of the oxide semiconductor layer of such a thickness makes it possible to suppress a short-channel effect which is caused by miniaturization. Note that the appropriate thickness of the oxide semiconductor layer differs depending on the oxide semiconductor material to be used, the application of the semiconductor device, or the like; therefore, the thickness can also be determined in accordance with the material, the application or the like.

Note that before the oxide semiconductor layer is formed by a sputtering method, reverse sputtering in which plasma is generated with an argon gas introduced is preferably performed, so that substances attached to a surface on which the oxide semiconductor layer is to be formed (e.g., a surface of the insulating layer 128) are removed. Here, the reverse sputtering refers to a method in which ions collide with a surface of the object to be processed in order to modify the surface, in contrast to normal sputtering which refers to a method in which ions collide with a sputtering target. An example of a method for making ions collide with a surface to be processed is a method in which high-frequency voltage is applied to the surface in an argon atmosphere so that plasma is generated near an object. Note that an atmosphere of nitrogen, helium, oxygen, or the like may be used instead of an argon atmosphere.

After that, heat treatment (first heat treatment) is preferably performed on the oxide semiconductor layer. By the first heat treatment, hydrogen (including water and a compound having a hydroxyl group) in the oxide semiconductor layer can be removed, the structure of the oxide semiconductor layer can be improved, and defect levels in the energy gap can be reduced. The temperature of the first heat treatment is, for example, higher than or equal to 300° C. and lower than 550° C., or higher than or equal to 400° C. and lower than or equal to 500° C.

The heat treatment can be performed in such a manner that, for example, the object is introduced into an electric furnace provided with a resistance heating element or the like and heated at 450° C. for one hour in a nitrogen atmosphere. During the heat treatment, the oxide semiconductor layer is not exposed to air to prevent entry of water and hydrogen.

The heat treatment apparatus is not limited to an electric furnace and may be an apparatus for heating an object by thermal conduction or thermal radiation from a medium such as a heated gas. For example, a rapid thermal anneal (RTA) apparatus such as a gas rapid thermal anneal (GRTA) or a lamp rapid thermal anneal (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas that does not react with the object by heat treatment, for example, nitrogen or a rare gas such as argon is used.

For example, as the first heat treatment, GRTA treatment may be performed in which the object is put in a heated inert gas atmosphere and heated for several minutes, and then taken out of the inert gas atmosphere. GRTA treatment enables high-temperature heat treatment for a short time. Moreover, GRTA treatment enables treatment at a temperature which exceeds the upper temperature limit of the object to be treated. Note that the inert gas may be changed to a gas including oxygen during the treatment. This is because defect levels in the energy gap due to oxygen defects can be reduced by performing the first heat treatment in an atmosphere including oxygen.

Note that as the inert gas atmosphere, an atmosphere that includes nitrogen or a rare gas (such as helium, neon, or argon) as its main component and does not include water, hydrogen, or the like is preferably used. For example, the purity of nitrogen or a rare gas such as helium, neon, or argon introduced into the heat treatment apparatus is higher than or equal to 6N (99.9999%), preferably higher than or equal to 7N (99.99999%) (that is, the concentration of an impurity is lower than or equal to 1 ppm, preferably lower than or equal to 0.1 ppm).

In any case, impurities are reduced by the first heat treatment; thus, the i-type (intrinsic) or substantially i-type oxide semiconductor layer is obtained. Accordingly, a transistor having significantly excellent characteristics can be obtained.

The above heat treatment (the first heat treatment) has an effect of removing hydrogen, water, and the like and can also be referred to as dehydration treatment, dehydrogenation treatment, or the like. The dehydration treatment or dehydrogenation treatment can be performed, for example, after the oxide semiconductor layer is formed, after the gate insulating layer is formed, or after a gate electrode is formed. Such dehydration treatment or dehydrogenation treatment may be performed once or more times.

The etching of the oxide semiconductor layer may be performed before or after the heat treatment. Dry etching is preferably used in terms of element miniaturization, but wet etching may be used. An etching gas and an etchant can be selected as appropriate in accordance with a material to be etched. Note that in the case where leakage of an element or the like does not cause a problem, the oxide semiconductor layer may be used without being processed into an island shape.

Then, the gate insulating layer 146 is formed in contact with the oxide semiconductor layer 144. After that, over the gate insulating layer 146, the gate electrode 148a is formed in a region overlapping with part of the oxide semiconductor layer 144 and the electrode 148b is formed in a region overlapping with the source or drain electrode 142a (see FIG. 4C).

The gate insulating layer 146 can be formed by a CVD method, a sputtering method, or the like. The gate insulating layer 146 preferably includes silicon oxide, silicon nitride, silicon oxynitride, aluminum oxide, tantalum oxide, hafnium oxide, yttrium oxide, hafnium silicate ($HfSi_xO_y$ (x>0, y>0)), hafnium silicate to which nitrogen is added, hafnium aluminate to which nitrogen is added, gallium oxide, and the like. The gate insulating layer 146 may have a single-layer structure or a stacked-layer structure. There is no particular limitation on the thickness of the gate insulating layer 146; in the case where the semiconductor device is miniaturized, the gate insulating layer 146 is preferably thin in order to ensure the operation of the transistor. For example, in the case of using silicon oxide, the thickness can be greater than or equal to 1 nm and less than or equal to 100 nm, preferably greater than or equal to 10 nm and less than or equal to 50 nm.

When the gate insulating layer is thin as in the above description, a problem of gate leakage due to a tunneling effect or the like is caused. In order to solve the problem of gate leakage, it is preferable that the gate insulating layer 146 be formed using a high dielectric constant (high-k) material such as hafnium oxide, tantalum oxide, yttrium oxide, hafnium silicate, hafnium silicate to which nitrogen is added, or hafnium aluminate to which nitrogen is added. By using a high-k material for the gate insulating layer 146, electrical characteristics can be ensured and the thickness of the gate insulating layer 146 can be large to prevent gate leakage. Note that a stacked-layer structure of a film including a high-k material and a film including any of silicon oxide, silicon nitride, silicon oxynitride, silicon nitride oxide, aluminum oxide, and the like may be employed.

After the gate insulating layer 146 is formed, second heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for one hour in a nitrogen atmosphere. The second heat treatment can reduce variation in electric characteristics of the transistors. Moreover, in the case where the gate insulating layer 146 includes oxygen, oxygen can be supplied to the oxide semiconductor layer 144 to compensate oxygen defects in the oxide semiconductor layer 144, whereby an i-type (intrinsic) or substantially i-type oxide semiconductor layer can be formed.

Note that the second heat treatment is performed after the gate insulating layer 146 is formed in this embodiment, but the timing of the second heat treatment is not limited to this. For example, the second heat treatment may be performed after the gate electrode is formed. Alternatively, the first heat treatment and the second heat treatment may be successively performed, the first heat treatment may double as the second heat treatment, or the second heat treatment may double as the first heat treatment.

As described above, at least one of the first heat treatment and the second heat treatment is employed, whereby impurities which are not the main components of the oxide semiconductor are excluded as much as possible and the oxide semiconductor layer 144 can be purified.

The gate electrode 148a and the electrode 148b can be formed by forming a conductive layer over the gate insulating layer 146 and then selectively etching the conductive layer. The conductive layer to be processed into the gate electrode 148a and the electrode 148b can be formed by a PVD method such as a sputtering method, or a CVD method such as a plasma CVD method. The details are similar to those of the source electrode 142a and the drain electrode 142b; thus, the description thereof can be referred to.

Note that the width of the gate electrode 148a in the channel length direction may be appropriately set so that an offset region is provided, in the oxide semiconductor layer 144, in at least one of a region between the source electrode 142a and the channel formation region or a region between the drain electrode 142b and the channel formation region. Note that the offset width of the offset region ($L_{OFF\_S}$) on the source electrode side and the offset width of the offset region ($L_{OFF\_D}$) on the drain electrode side are not necessarily the same, but the total value of the offset widths of the $L_{OFF\_S}$ and the $L_{OFF\_D}$ of the transistor 162 is the same as those of other transistors 162. The offset width of the $L_{OFF\_S}$ or the $L_{OFF\_D}$ needs to be greater than 0 nm and is preferably equal to or less than 2 µm. The offset region serves as a resistance region which is not affected or is difficult to be affected by an electric field of the gate electrode, and is therefore effective in further reducing the off-state current of the transistor 162.

Note that it is preferable that the offset region be provided at least on the source electrode 142a side. By providing an offset region on the source electrode 142a side, parasitic capacitance between the gate electrode 148a of the transistor 162 and a portion (a floating gate portion) where the source electrode 142a and the gate electrode 110 of the transistor 160 are electrically connected to each other can be reduced. As a result, in write or read operation, the gate electrode 148a of the transistor 162 has less influence on the potential of the floating gate portion, whereby a semiconductor device capable of stable operation can be provided.

The electrode 148b which is a capacitor electrode is preferably formed to overlap with at least part of the gate electrode 110 of the transistor 160. This is because by employing such a structure, the area of the circuit can be sufficiently reduced.

Figure 5A:
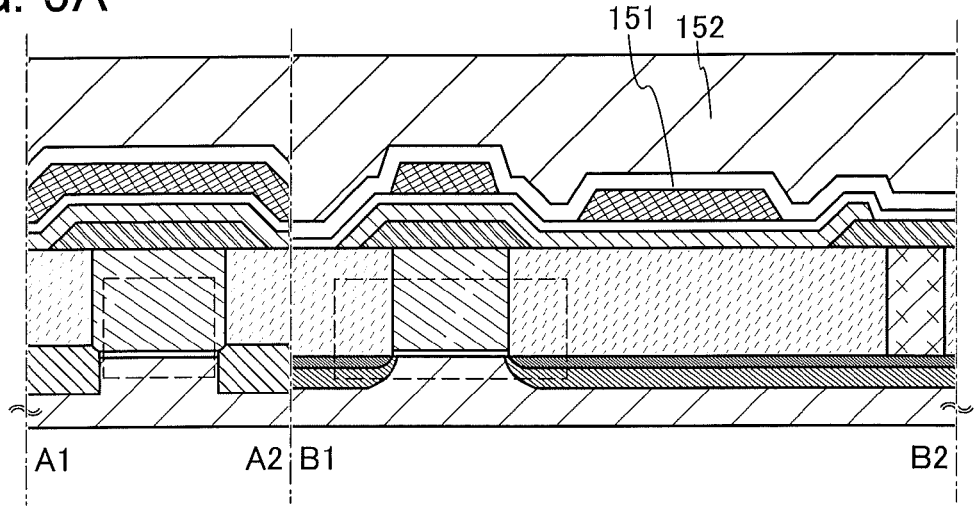
FIGS. 5A to 5C are cross-sectional views of a manufacturing process of a semiconductor device.

Then, the insulating layer 151 and the insulating layer 152 are formed over the gate insulating layer 146, the gate electrode 148a, and the electrode 148b (see FIG. 5A). The insulating layer 151 and the insulating layer 152 can be formed by a PVD method, a CVD method, or the like. The insulating layer 151 and the insulating layer 152 can be formed using a material including an inorganic insulating material such as silicon oxide, silicon oxynitride, silicon nitride, hafnium oxide, aluminum oxide, or gallium oxide.

Note that for the insulating layer 151 and the insulating layer 152, a material with a low dielectric constant may be preferably used or a structure with a low dielectric constant (e.g., a porous structure) may be preferably employed. This is because when the insulating layer 151 and the insulating layer 152 have a low dielectric constant, capacitance generated between wirings, electrodes, or the like can be reduced and operation at higher speed can be achieved.

Note that although a stacked-layer structure of the insulating layer 151 and the insulating layer 152 is used in this embodiment, one embodiment of the present invention is not limited thereto. The insulating layer over the transistor 162 and the capacitor 164 may have a single-layer structure or a stacked-layer structure including three or more layers. Alternatively, the insulating layer may be omitted.

Note that the insulating layer 152 is preferably formed so as to have a planarized surface. This is because when the insulating layer 152 has a planarized surface, an electrode, a wiring, or the like can be favorably formed over the insulating layer 152 even in the case where the semiconductor device is miniaturized. Note that the insulating layer 152 can be planarized by a method such as CMP treatment.

Figure 5B:
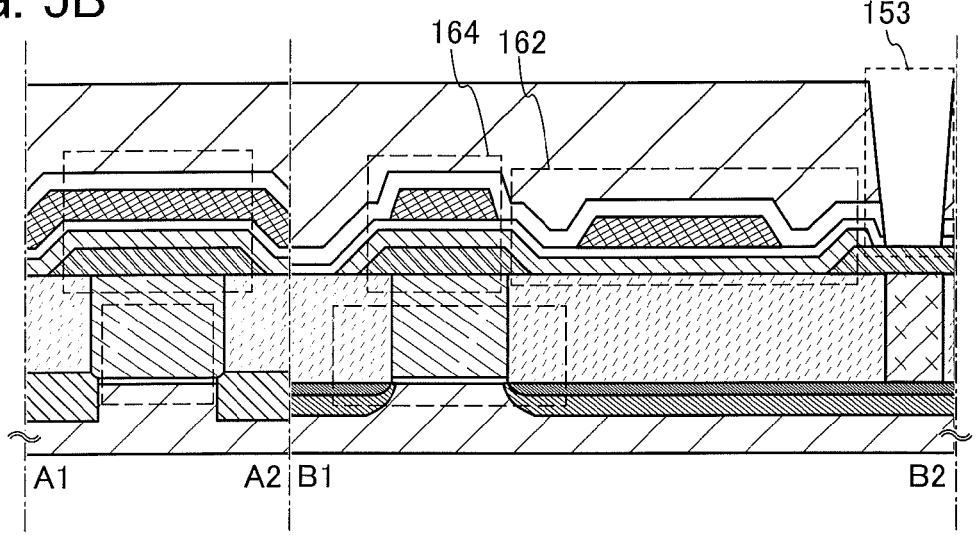

Then, an opening 153 reaching the drain electrode 142b is formed in the gate insulating layer 146, the insulating layer 151, and the insulating layer 152 (see FIG. 5B). The opening 153 is formed by selective etching using a mask or the like.

Here, the opening 153 is preferably formed in a region overlapping with the electrode 126. By forming the opening 153 in this region, the element area can be prevented from increasing due to a contact region of the electrodes. In other words, the degree of integration in the semiconductor device can be improved.

Figure 5C:
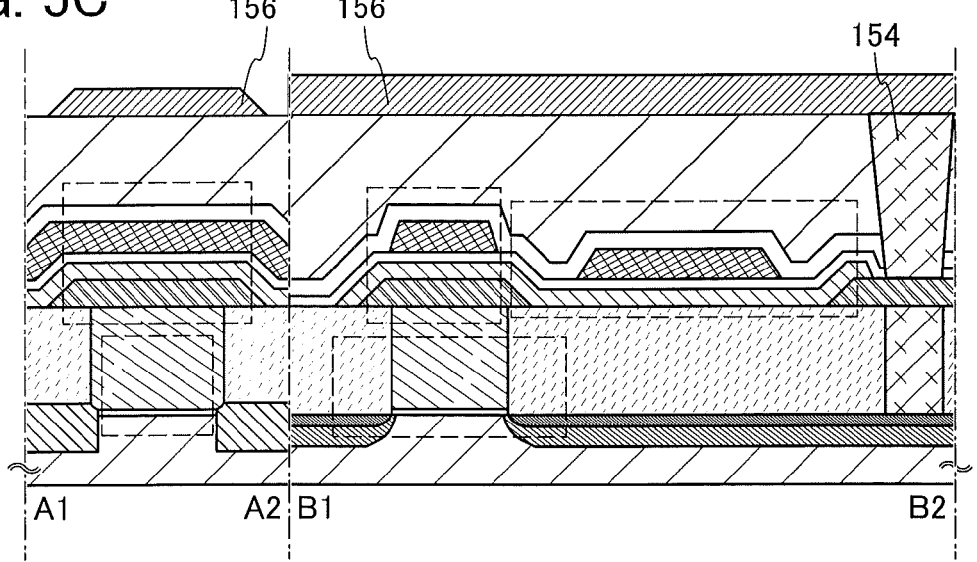

Then, the electrode 154 is formed in the opening 153 and the wiring 156 in contact with the electrode 154 is formed over the insulating layer 152 (see FIG. 5C).

The electrode 154 can be formed in such a manner that, for example, a conductive layer is formed by a PVD method, a CVD method, or the like in a region including the opening 153 and then part of the conductive layer is removed by etching treatment, CMP treatment, or the like.

Specifically, for example, it is possible to employ a method in which a thin titanium film is formed by a PVD method and a thin titanium nitride film is formed by a CVD method in a region including the opening 153, and then a tungsten film is formed so as to fill the opening 153. Here, the titanium film formed by a PVD method has a function of reducing an oxide film (such as a native oxide film) over which the titanium film is to be formed, and thereby lowering contact resistance with the underlying electrode or the like (the drain electrode 142b, here). The titanium nitride film formed after the formation of the titanium film has a barrier function of preventing diffusion of the conductive material. A copper film may be formed by a plating method after the formation of the barrier film of titanium, titanium nitride, or the like.

Note that in the case where the electrode 154 is formed by removing part of the conductive layer, it is preferable that a surface of the electrode 154 be processed to be planarized. For example, when a thin titanium film or a thin titanium nitride film is formed in a region including the opening 153 and then a tungsten film is formed so as to fill the opening 153, excessive tungsten, titanium, titanium nitride, or the like can be removed and the planarity of the surface can be improved by subsequent CMP treatment. The surface including the electrode 154 is planarized in this manner, whereby an electrode, a wiring, an insulating layer, a semiconductor layer, or the like can be favorably formed in later steps.

The wiring 156 is formed by forming a conductive layer by a PVD method such as a sputtering method, or a CVD method such as a plasma CVD method, and then by patterning the conductive layer. As a material for the conductive layer, an element selected from aluminum, chromium, copper, tantalum, titanium, molybdenum, and tungsten; an alloy including any of these elements as a component; or the like can be used. A material including one of manganese, magnesium, zirconium, beryllium, neodymium, and scandium or a combination of a plurality of these elements may be used. The details are similar to those of the source electrode 142a, the drain electrode 142b, and the like.

Through the above steps, the transistor 162 including the purified oxide semiconductor layer 144 and the capacitor 164 are completed (see FIG. 5C).

In the transistor 162 described in this embodiment, because the oxide semiconductor layer 144 is purified, the hydrogen concentration thereof is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$. In addition, the carrier density of the oxide semiconductor layer 144 is sufficiently low (e.g., lower than $1 \times 10^{12}$/cm$^3$, preferably lower than $1.45 \times 10^{10}$/cm$^3$) as compared to the carrier density of a general silicon wafer (approximately $1 \times 10^{14}$/cm$^3$). Thus, the off-state current is sufficiently low.

By using the oxide semiconductor layer 144 which is purified to be intrinsic, the off-state current of the transistor can be sufficiently reduced. Further, with the use of such a transistor, a semiconductor device capable of holding stored data for an extremely long time can be obtained.

Further, an oxide semiconductor has a wide energy gap of 3.0 eV to 3.5 eV and a very small number of thermally excited carriers. Therefore, characteristics of the transistor 162 including an oxide semiconductor do not deteriorate and an off-state current can be kept extremely low even at high temperatures. In particular, provision of an offset region in the oxide semiconductor layer 144 of the transistor 162 is effective in further reducing the off-state current of the transistor 162.

MODIFICATION EXAMPLE

Next, another structure of the semiconductor device of this embodiment will be described with reference to FIGS. 6A and 6B.

<Cross-sectional Structure and Planar Structure of Semiconductor Device>

Figure 6A:
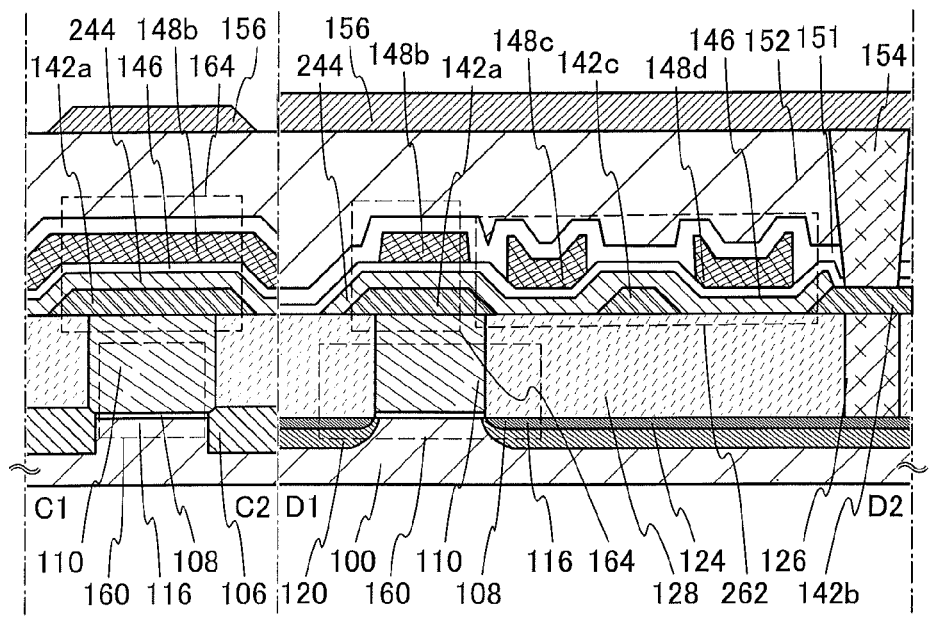
FIGS. 6A and 6B are a cross-sectional view and a plan view of a semiconductor device.
Figure 6B:
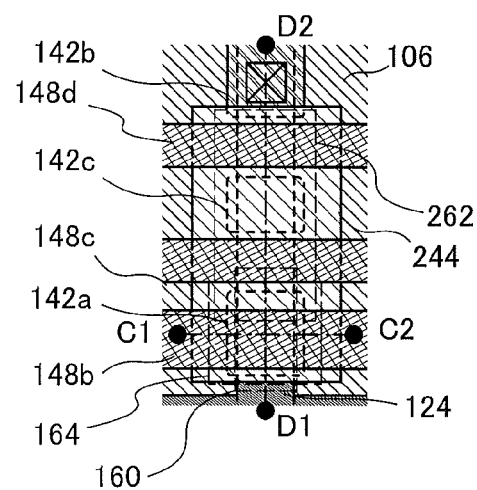

FIG. 6A is a cross-sectional view of the semiconductor device, and FIG. 6B is a plan view of the semiconductor device. Here, FIG. 6A illustrates a cross section taken along line C1-C2 and line D1-D2 in FIG. 6B. The semiconductor device illustrated in FIGS. 6A and 6B, like the semiconductor device illustrated in FIGS. 1A and 1B, includes the transistor 160 including a first semiconductor material in the lower portion, and a transistor 262 including a second semiconductor material in the upper portion. Here, it is preferable that the first semiconductor material and the second semiconductor material be different from each other. For example, the first semiconductor material can be a material other than an oxide semiconductor and the second semiconductor material can be an oxide semiconductor. A transistor including a semiconductor material (e.g., single crystal silicon) other than an oxide semiconductor can easily operate at high speed. On the other hand, a transistor including an oxide semiconductor can hold charge for a long time owing to its characteristics.

The semiconductor device in FIGS. 6A and 6B is different from the semiconductor device in FIGS. 1A and 1B in that the transistor 262 is a multi-gate transistor which includes, over an oxide semiconductor layer 244, a first gate electrode 148c and a second gate electrode 148d to which a potential equal to that applied to the first gate electrode 148c is applied.

The transistor 262 in FIGS. 6A and 6B includes the source electrode (or the drain electrode) 142a and the drain electrode (or the source electrode) 142b over the insulating layer 128; an electrode 142c between the source electrode 142a and the drain electrode 142b; the oxide semiconductor layer 244 electrically connected to the source electrode 142a, the electrode 142c, and the drain electrode 142b; the gate insulating layer 146 covering the source electrode 142a, the electrode 142c, the drain electrode 142b, and the oxide semiconductor layer 244; and the first gate electrode 148c and the second gate electrode 148d which are over the gate insulating layer 146 to overlap with part of the oxide semiconductor layer 244. Note that the electrode 142c is not necessarily provided.

The oxide semiconductor layer 244 includes a first channel formation region overlapping with the first gate electrode 148c, a second channel formation region overlapping with the second gate electrode 148d, and offset regions which are in contact with the first channel formation region or the second channel formation region. The offset region in the oxide semiconductor layer 244 overlaps with neither the source electrode 142a, the electrode 142c, the drain electrode 142b, the first gate electrode 148c, nor the second gate electrode 148d.

By providing the offset region in the oxide semiconductor layer 244 of the transistor 262 as in FIGS. 6A and 6B, the offset region serves as a resistance region; therefore, the off-state current of the transistor 262 can be further reduced. In addition, by forming the transistor 262 as a multi-gate structure, the off-state current of the transistor 262 can be further reduced.

Note that the electrode 142c of the transistor 262 can be formed by a process similar to that of the source electrode 142a and the drain electrode 142b. The oxide semiconductor layer 244 of the transistor 262 can be formed by a process similar to that of the oxide semiconductor layer 144 of the transistor 162. The first gate electrode 148c and the second gate electrode 148d of the transistor 262 are formed by a process similar to that of the electrode 148b. For details of the manufacturing process of the transistor 262, the manufacturing process of the transistor 162 can be referred to.

The structures, the methods, and the like described in this embodiment can be combined as appropriate with any of the structures, the methods, and the like described in the other embodiments.

(Embodiment 2)

In this embodiment, a structure and a method for manufacturing a semiconductor device according to another embodiment of the disclosed invention will be described with reference to FIGS. 7A and 7B, FIGS. 8A to 8C, and FIGS. 9A to 9C.

<Cross-sectional Structure and Planar Structure of Semiconductor Device>

Figure 7A:
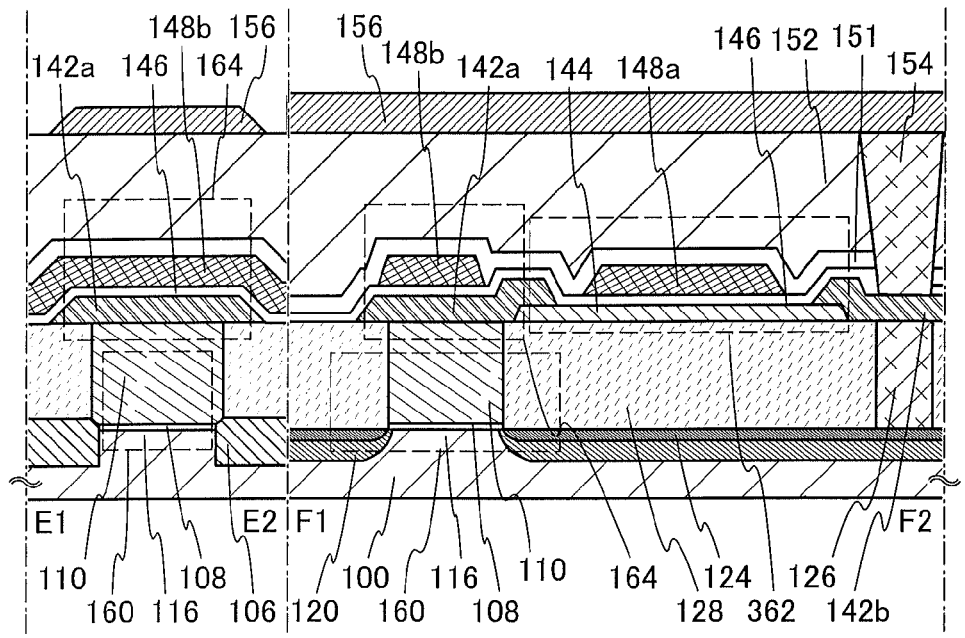
FIGS. 7A and 7B are a cross-sectional view and a plan view of a semiconductor device.
Figure 7B:
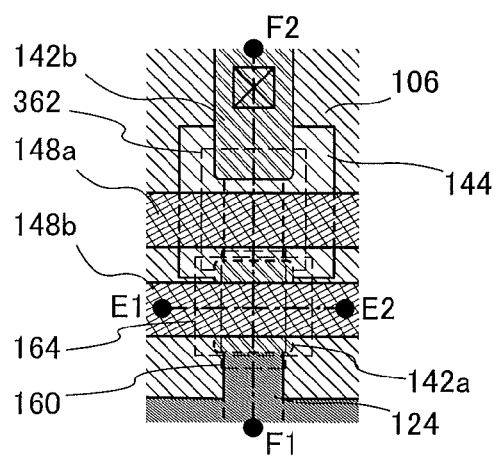

FIGS. 7A and 7B illustrate an example of a structure of the semiconductor device according to this embodiment. FIG. 7A is a cross-sectional view of the semiconductor device, and FIG. 7B is a plan view of the semiconductor device. Here, FIG. 7A illustrates a cross section taken along line E1-E2 and line F1-F2 in FIG. 7B. The semiconductor device illustrated in FIGS. 7A and 7B includes the transistor 160 including a first semiconductor material in the lower portion, and a transistor 362 including a second semiconductor material in the upper portion. Here, it is preferable that the first semiconductor material and the second semiconductor material be different from each other. For example, the first semiconductor material can be a material other than an oxide semiconductor and the second semiconductor material can be an oxide semiconductor. A transistor including a semiconductor material (e.g., single crystal silicon) other than an oxide semiconductor can easily operate at high speed. On the other hand, a transistor including an oxide semiconductor can hold charge for a long time owing to its characteristics.

Although both of the transistors are n-channel transistors in this description, it should be appreciated that p-channel transistors can be used. Since the technical essence of the disclosed invention lies in the use of a material which can sufficiently reduce an off-state current, such as an oxide semiconductor, for the transistor 362 in order to hold data, it is not necessary to limit specific conditions such as a material, a structure, or the like of the semiconductor device to those given here.

The transistor 160 in FIGS. 7A and 7B is similar to the transistor 160 in FIGS. 1A and 1B. In other words, the transistor 160 in FIGS. 7A and 7B includes the channel formation region 116 provided in the substrate 100 including a semiconductor material (e.g., silicon), the impurity regions 120 provided so that the channel formation region 116 is sandwiched therebetween, the metal compound regions 124 in contact with the impurity regions 120, the gate insulating layer 108 provided over the channel formation region 116, and the gate electrode 110 provided over the gate insulating layer 108. Embodiment 1 can be referred to for the details.

The capacitor 164 in FIGS. 7A and 7B is similar to the capacitor 164 in FIGS. 1A and 1B. In other words, the capacitor 164 in FIGS. 7A and 7B includes the source electrode 142a, the oxide semiconductor layer 144, the gate insulating layer 146, and the electrode 148b. The source electrode 142a serves as one electrode of the capacitor 164 and the electrode 148b serves as the other electrode of the capacitor 164. Embodiment 1 can be referred to for the other details.

The difference between the transistor 362 in FIGS. 7A and 7B and the transistor 162 in FIGS. 1A and 1B is the stacking order of the source and the drain electrodes 142a and 142b and the oxide semiconductor layer 144. In other words, the transistor 362 in FIGS. 7A and 7B includes the oxide semiconductor layer 144; the source electrode 142a and the drain electrode 142b over the oxide semiconductor layer 144; the gate insulating layer 146 covering the source electrode 142a, the drain electrode 142b, and the oxide semiconductor layer 144; and the gate electrode 148a which is over the gate insulating layer 146 and overlaps with part of the oxide semiconductor layer 144.

The oxide semiconductor layer 144 includes a channel formation region which overlaps with the gate electrode 148a and an offset region which is in contact with the channel formation region. In the oxide semiconductor layer 144, the offset region is a region which overlaps with neither the source electrode 142a, the drain electrode 142b, nor the gate electrode 148a.

Note that, it is preferable that the oxide semiconductor layer 144 be purified by sufficient removal of impurities such as hydrogen and/or sufficient supply of oxygen.

As in the semiconductor device in FIGS. 1A and 1B, in the semiconductor device in FIGS. 7A and 7B the insulating layer 151 is provided over the transistor 362 and the capacitor 164, and the insulating layer 152 is provided over the insulating layer 151. The electrode 154 is provided in an opening formed in the gate insulating layer 146, the insulating layer 151, the insulating layer 152, and the like, and the wiring 156 is formed over the insulating layer 152 to be connected to the electrode 154. The wiring 156 electrically connects one memory cell to another memory cell. Note that although the metal compound region 124, the drain electrode 142b, and the wiring 156 are connected to one another through the electrode 126 and the electrode 154 in FIGS. 7A and 7B, the disclosed invention is not limited thereto.

Note that in FIGS. 7A and 7B, the electrode 126 for connecting the metal compound region 124 to the drain electrode 142b and the electrode 154 for connecting the drain electrode 142b to the wiring 156 overlap with each other. In other words, a region in which the electrode 126 serving as a source electrode or a drain electrode of the transistor 160 is in contact with the drain electrode 142b of the transistor 362 overlaps with a region in which the drain electrode 142b of the transistor 362 is in contact with the electrode 154. Such a layout allows higher integration.

<Method for Manufacturing Semiconductor Device>

Next, an example of a method for manufacturing the semiconductor device will be described. Note that in the semiconductor device described in this embodiment, the transistor 160 in the lower portion can be manufactured in a process similar to that in Embodiment 1; therefore, Embodiment 1 can be referred to. A method for manufacturing the transistor 362 in the upper portion and the capacitor 164 will be described with reference to FIGS. 8A to 8C and FIGS. 9A to 9C.

<Method for Manufacturing Transistor in Upper Portion>

Figure 8A:
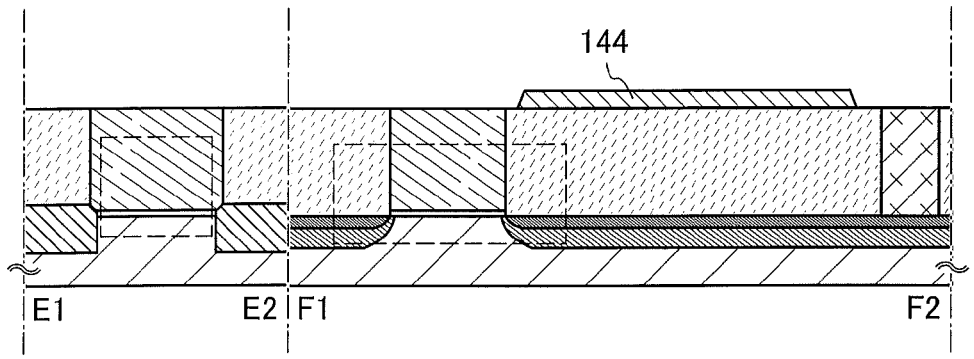
FIGS. 8A to 8C are cross-sectional views of a manufacturing process of a semiconductor device.

An oxide semiconductor layer is formed over the gate electrode 110, the electrode 126, the insulating layer 128, and the like, and is selectively etched to form the oxide semiconductor layer 144 (see FIG. 8A). Note that for the material and formation conditions of the oxide semiconductor layer 144, the material and formation conditions in Embodiment 1 can be employed.

Heat treatment (first heat treatment) is preferably performed on the formed oxide semiconductor layer. By the first heat treatment, hydrogen (including water and a compound having a hydroxyl group) in the oxide semiconductor layer can be removed, the structure of the oxide semiconductor layer can be improved, and defect levels in the energy gap can be reduced. The temperature of the first heat treatment is, for example, higher than or equal to 300° C. and lower than 550° C., or higher than or equal to 400° C. and lower than or equal to 500° C.

Impurities are reduced by the first heat treatment; thus, the i-type (intrinsic) or substantially i-type oxide semiconductor layer is obtained. Accordingly, a transistor having significantly excellent characteristics can be obtained.

The etching of the oxide semiconductor layer may be performed before or after the heat treatment. Dry etching is preferably used in terms of element miniaturization, but wet etching may be used. An etching gas and an etchant can be selected as appropriate in accordance with a material to be etched.

Figure 8B:
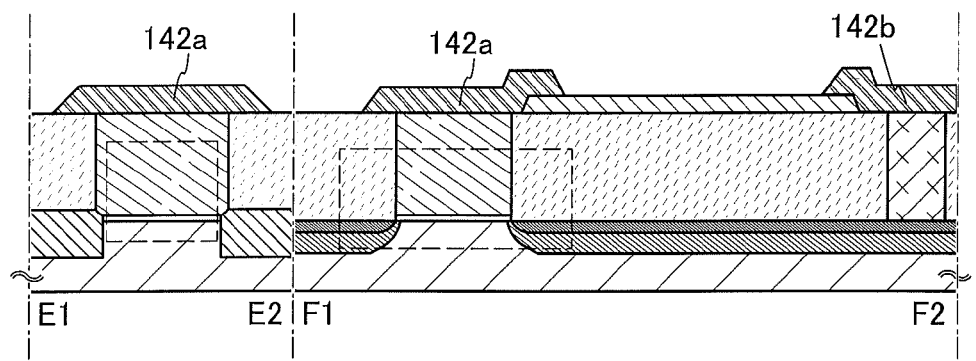
Figure 8C:
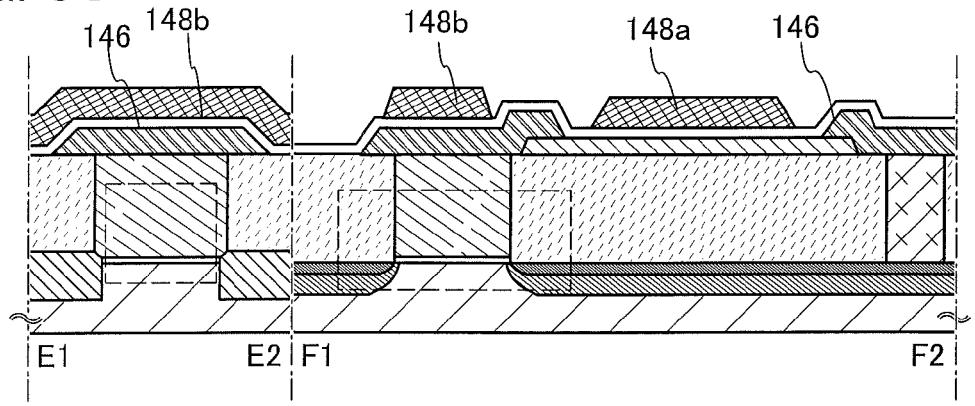

Next, a conductive layer is formed over the oxide semiconductor layer 144 and is selectively etched to form the source electrode 142a and the drain electrode 142b (see FIG. 8B). For the material, formation conditions, and the like of the conductive layer for forming the source electrode 142a and the drain electrode 142b, Embodiment 1 can be referred to.

The conductive layer is preferably etched so that the source electrode 142a and the drain electrode 142b have tapered end portions. Here, the taper angle is preferably greater than or equal to 30° and less than or equal to 60°, for example. When the source electrode 142a and the drain electrode 142b are etched to have tapered end portions, the coverage with the gate insulating layer 146 formed later can be improved and a break thereof due to a step can be prevented.

Then, the gate insulating layer 146 is formed to cover the source electrode 142a, the drain electrode 142b, and the oxide semiconductor layer 144 in contact with the oxide semiconductor layer 144. After that, over the gate insulating layer 146, the gate electrode 148a is formed in a region overlapping with part of the oxide semiconductor layer 144 and the electrode 148b is formed in a region overlapping with the source electrode 142a (see FIG. 8C). For the material, formation conditions, and the like of the conductive layer for forming the gate insulating layer 146, Embodiment 1 can be referred to. In addition, for the material, formation conditions, and the like of the conductive layer for forming the gate electrode 148a and the electrode 148b, Embodiment 1 can be referred to.

After the gate insulating layer 146 is formed, second heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for one hour in a nitrogen atmosphere. The second heat treatment can reduce variation in electric characteristics of the transistors. Moreover, in the case where the gate insulating layer 146 includes oxygen, oxygen can be supplied to the oxide semiconductor layer 144 to compensaete oxygen defects in the oxide semiconductor layer 144, whereby an i-type (intrinsic) or substantially i-type oxide semiconductor layer can be formed.

Note that the second heat treatment is performed after the gate insulating layer 146 is formed in this embodiment, but the timing of the second heat treatment is not limited to this. For example, the second heat treatment may be performed after the gate electrode is formed. Alternatively, the first heat treatment and the second heat treatment may be successively performed, the first heat treatment may double as the second heat treatment, or the second heat treatment may double as the first heat treatment.

As described above, at least one of the first heat treatment and the second heat treatment is employed, whereby impurities which are not the main components of the oxide semiconductor are excluded as much as possible and the oxide semiconductor layer 144 can be purified.

Note that the width of the gate electrode 148a in the channel length direction may be appropriately set so that an offset region is provided, in the oxide semiconductor layer 144, in at least one of a region between the source electrode 142a and the channel formation region or a region between the drain electrode 142b and the channel formation region. Note that the offset width of the offset region ($L_{OFF\_S}$) on the source electrode side and the offset width of the offset region ($L_{OFF\_D}$) on the drain electrode side are not necessarily the same, but the total value of the offset widths of $L_{OFF\_S}$ and the $L_{OFF\_D}$ of the transistor 362 is the same as those of other transistors 362. The offset width of the $L_{OFF\_S}$ or the $L_{OFF\_D}$ needs to be greater than 0 nm and is preferably equal to or less than 2 μm. The offset region serves as a resistance region which is not affected or is difficult to be affected by an electric field of the gate electrode, and is therefore effective in further reducing the off-state current of the transistor 362.

Note that it is preferable that the offset region be provided at least on the source electrode 142a side. By providing an offset region on the source electrode 142a side, parasitic capacitance between the gate electrode 148a of the transistor 362 and a portion (a floating gate portion) where the source electrode 142a and the gate electrode 110 of the transistor 160 are electrically connected to each other can be reduced. As a result, in write or read operation, the gate electrode 148a of the transistor 362 has less influence on the potential of the floating gate portion, whereby a semiconductor device capable of stable operation can be provided.

The electrode 148b which is a capacitor electrode is preferably formed to overlap with at least part of the gate electrode 110 of the transistor 160. This is because by employing such a structure, the area of the circuit can be sufficiently reduced.

Figure 9A:
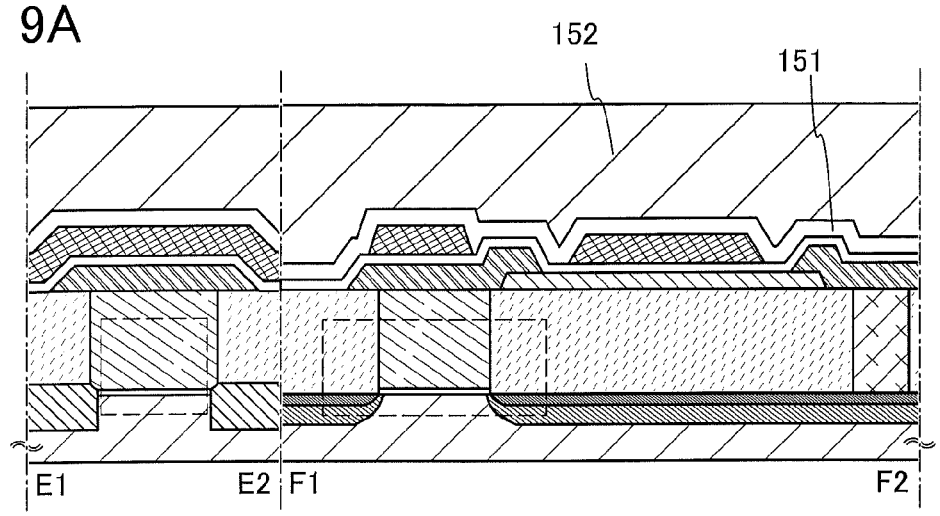
FIGS. 9A to 9C are cross-sectional views of a manufacturing process of a semiconductor device.

Then, as in a step in FIG. 5A described in Embodiment 1, the insulating layer 151 and the insulating layer 152 are formed over the gate insulating layer 146, the gate electrode 148a, and the electrode 148b (see FIG. 9A).

Figure 9B:
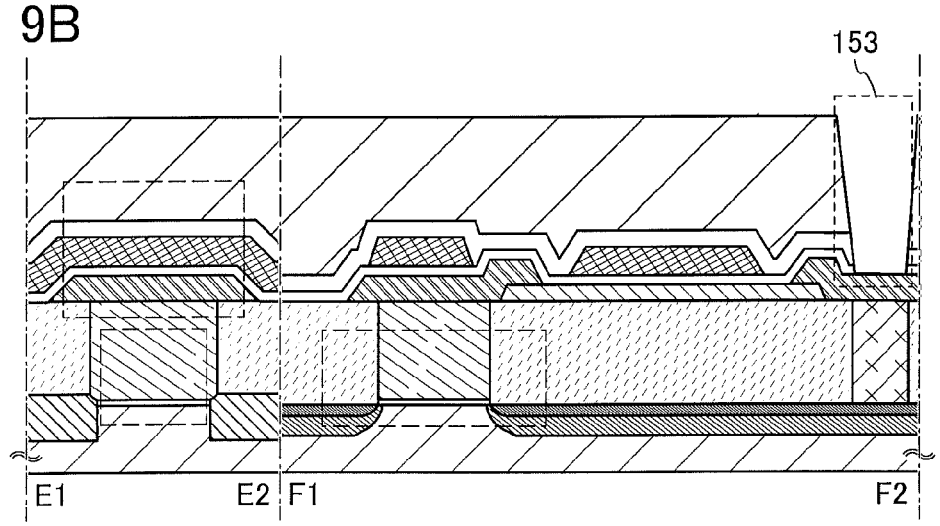

Then, the opening 153 reaching the drain electrode 142b is formed in the gate insulating layer 146, the insulating layer 151, and the insulating layer 152 (see FIG. 9B). The opening 153 is formed by selective etching using a mask or the like.

Here, the opening 153 is preferably formed in a region overlapping with the electrode 126. By forming the opening 153 in this region, the element area can be prevented from increasing due to a contact region of the electrodes. In other words, the degree of integration in the semiconductor device can be improved.

Figure 9C:
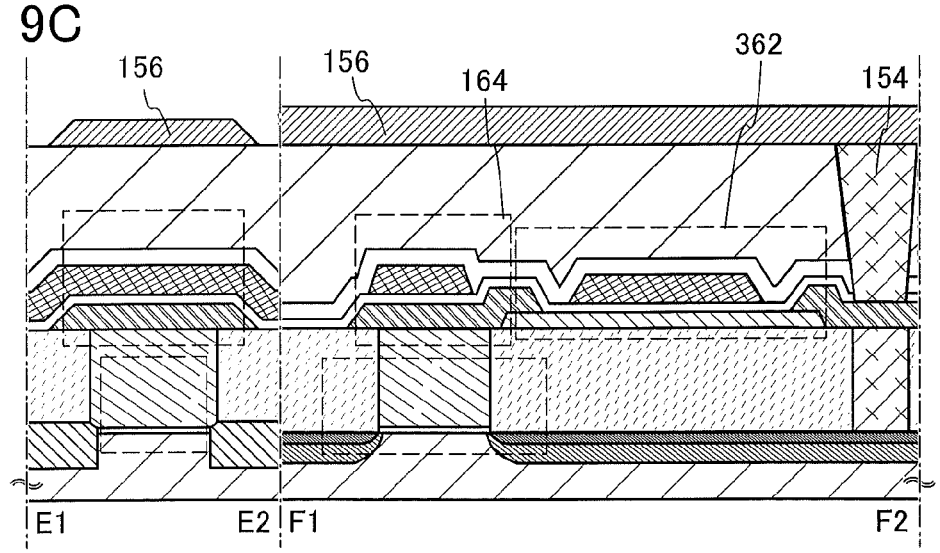

Then, as in a step in FIG. 5C described in Embodiment 1, the electrode 154 is formed in the opening 153 and the wiring 156 in contact with the electrode 154 is formed over the insulating layer 152 (see FIG. 9C).

Through the above steps, the transistor 362 including the purified oxide semiconductor layer 144 and the capacitor 164 are completed (see FIG. 9C).

In the transistor 362 described in this embodiment, because the oxide semiconductor layer 144 is purified, the hydrogen concentration thereof is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$. In addition, the carrier density of the oxide semiconductor layer 144 is sufficiently low (e.g., lower than $1 \times 10^{12}$/cm$^3$, preferably lower than $1.45 \times 10^{10}$/cm$^3$) as compared to the carrier density of a general silicon wafer (approximately $1 \times 10^{14}$/cm$^3$). Thus, the off-state current is sufficiently low.

By using the oxide semiconductor layer 144 which is purified to be intrinsic, the off-state current of the transistor can be sufficiently reduced. Further, with the use of such a transistor, a semiconductor device capable of holding stored data for an extremely long time can be obtained.

Further, an oxide semiconductor has a wide energy gap of 3.0 eV to 3.5 eV and a very small number of thermally excited carriers. Therefore, characteristics of the transistor 362 including an oxide semiconductor do not deteriorate and an off-state current can be kept extremely low even at high temperatures. In particular, provision of an offset region in the oxide semiconductor layer 144 of the transistor 362 is effective in further reducing the off-state current of the transistor 362.

The structures, the methods, and the like described in this embodiment can be combined as appropriate with any of the structures, the methods, and the like described in the other embodiments.

(Embodiment 3)

In this embodiment, a circuit structure and operation of a semiconductor device according to one embodiment of the disclosed invention will be described with reference to FIGS. 10A-1, 10A-2, and 10B. In the description of the circuit diagrams in FIGS. 10A-1, 10A-2, and 10B, reference numerals are the same as those in the semiconductor device in FIGS. 1A and 1B. Note that in circuit diagrams, "OS" is written beside a transistor in order to indicate that the transistor includes an oxide semiconductor.

Figures 1, 10A:
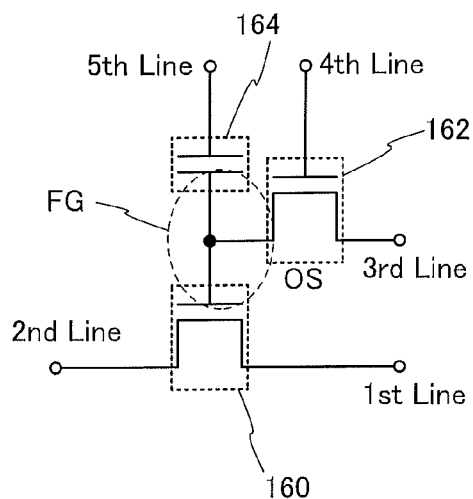
FIGS. 10A-1, 10A-2, and 10B are circuit diagrams of a semiconductor device.

In the semiconductor device in FIG. 10A-1, a first wiring (a 1st line) and the source electrode of the transistor 160 are electrically connected to each other, and a second wiring (a 2nd line) and the drain electrode of the transistor 160 are electrically connected to each other. A third wiring (a 3rd line) and the other of the source electrode or the drain electrode of the transistor 162 are electrically connected to each other, and a fourth wiring (a 4th line) and a gate electrode of the transistor 162 are electrically connected to each other. The gate electrode of the transistor 160 and the one of the source electrode or the drain electrode of the transistor 162 are electrically connected to the one electrode of the capacitor 164, and a fifth wiring (a 5th line) and the other electrode of the capacitor 164 are electrically connected to each other.

Here, the above transistor including an oxide semiconductor is used as the transistor 162, for example. A transistor including an oxide semiconductor has an extremely small off-state current. In addition, since an oxide semiconductor layer of the transistor 162 includes an offset region, the off-state current can be further reduced. Therefore, when the transistor 162 is in an off state, a potential in the gate electrode of the transistor 160 can be held for a very long time. The capacitor 164 facilitates holding of charge applied to the gate electrode of the transistor 160 and reading of the held data. Note that it should be appreciated that the transistor 262 or the transistor 362 can be employed in stead of the transistor 162.

Note that there is no particular limitation on the transistor 160. In order to increase the speed of reading data, it is preferable to use, for example, a transistor with high switching speed, such as a transistor formed using single crystal silicon.

Figure 10B:
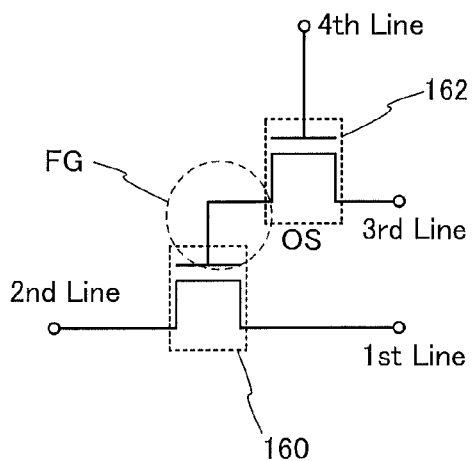

Alternatively, the capacitor 164 may be omitted as in FIG. 10B.

The semiconductor device in FIG. 10A-1 can write, hold, and read data as described below, utilizing a characteristic in which the potential of the gate electrode of the transistor 160 can be held.

Firstly, writing and holding of data will be described. The potential of the fourth wiring is set to a potential at which the transistor 162 is turned on, whereby the transistor 162 is turned on. Thus, the potential of the third wiring is applied to the gate electrode of the transistor 160 and one electrode of the capacitor 164. That is, predetermined charge is applied to the gate electrode of the transistor 160 (writing). Here, charge for applying either two different levels of potential (hereinafter, charge for applying a low potential is referred to as charge $Q_L$ and charge for applying a high potential is referred to as charge $Q_H$) is applied through the third wiring. Note that charge for applying three or more different levels of potential may be employed to improve storage capacity. After that, the potential of the fourth wiring is set to a potential at which the transistor 162 is turned off, whereby the transistor 162 is turned off. Thus, the charge applied to the gate electrode of the transistor 160 is held (holding).

Since the off-state current of the transistor 162 is significantly small, the charge of the gate electrode of the transistor 160 is held for a long time.

Secondly, reading of data will be described. While a predetermined potential (a fixed potential) is applied to the first wiring, an appropriate potential (a read-out potential) is applied to the fifth wiring, whereby the potential of the second wiring changes depending on the amount of charge held in the gate electrode of the transistor 160. This is because in general, when the transistor 160 is an n-channel transistor, an apparent threshold value $V_{th\_H}$ the case where $Q_H$ is applied to the gate electrode of the transistor 160 is lower than an apparent threshold value $V_{th\_L}$ in the case where $Q_L$ is applied to the gate electrode of the transistor 160. Here, an apparent threshold value refers to the potential of the fifth wiring which is needed to turn on the transistor 160. Thus, by setting the potential of the fifth wiring to a potential $V_0$ which is between $V_{th\_H}$ and $V_{th\_L}$, charge applied to the gate electrode of the transistor 160 can be determined. For example, in the case where $Q_H$ is applied in writing, when the potential of the fifth wiring is set to $V_0$ ($>V_{th\_H}$), the transistor 160 is turned on. In the case where $Q_L$ is applied in writing, even when the potential of the fifth wiring is set to $V_0$ ($<V_{th\_L}$), the transistor 160 remains off. Thus, the held data can be read by the potential of the second wiring.

Note that in the case where memory cells are arrayed, it is necessary to read out data only from a predetermined memory cell. In the case where data of the predetermined memory cell is read out and data of the other memory cells is not read out, a potential at which the transistor 160 is in an off state regardless of the state of the gate electrode of the transistor 160, that is, a potential lower than $V_{th\_H}$, may be applied to the fifth wirings of the memory cells whose data is not to be read. Alternatively, a potential at which the transistor 160 is in an on state regardless of the state of the gate electrode, that is, a potential higher than $V_{th\_L}$, may be applied to the fifth wirings of the memory cells whose data is not to be read.

Thirdly, rewriting of data will be described. Rewriting of data is performed in a manner similar to that of writing and holding of data. That is, the potential of the fourth wiring is set to a potential at which the transistor 162 is turned on, whereby the transistor 162 is turned on. Accordingly, the potential of the third wiring (a potential for new data) is applied to the gate electrode of the transistor 160 and the capacitor 164. After that, the potential of the fourth wiring is set to a potential at which the transistor 162 is turned off, whereby the transistor 162 is turned off. Thus, charge for the new data is applied to the gate electrode of the transistor 160.

In the semiconductor device according to the disclosed invention, data can be directly rewritten by another writing of data as described above. Therefore, extraction of charge from a floating gate with the use of high voltage, which is needed in a flash memory or the like, is not needed and a reduction in operation speed caused by erasing operation can be prevented. In other words, high-speed operation of the semiconductor device can be realized.

Note that one of the source electrode or the drain electrode of the transistor 162 is electrically connected to the gate electrode of the transistor 160, and thereby has an effect similar to that of a floating gate of a floating-gate transistor which is used as a non-volatile memory element. The portion where the one of the source electrode or the drain electrode of the transistor 162 and the gate electrode of the transistor 160 are electrically connected to each other is therefore called a floating gate portion FG in some cases. When the transistor 162 is in an off state, the floating gate portion FG can be regarded as being embedded in an insulator and thus charge is held in the floating gate portion FG. The off-state current of the transistor 162 including an oxide semiconductor is smaller than or equal to one hundred thousandth of the off-state current of a transistor including a silicon semiconductor or the like; thus, loss of the charge accumulated in the floating gate portion FG due to leakage of the transistor 162 is negligible. That is, with the transistor 162 including an oxide semiconductor, a non-volatile memory device which can hold data without power supply can be realized.

For example, when the off-state current of the transistor 162 is smaller than or equal to 10 zA (1 zA (zeptoampere) is $1\times10^{-21}$ A) at room temperature (25° C.) and the capacitance value of the capacitor 164 is approximately 10 fF, data can be held for $10^4$ seconds or longer. Note that it should be appreciated that the holding time changes depending on the transistor characteristics and the capacitance value.

Further, in this case, a problem of degradation of a gate insulating film (a tunnel insulating film), which occurs in a conventional floating-gate transistor; does not exist. That is, the problem of degradation of a gate insulating film due to injection of electrons into a floating gate, which has conventionally been a problem, can be solved. This means that there is no limit on the number of times of writing in principle. Furthermore, high voltage needed for writing or erasing in a conventional floating-gate transistor is not necessary.

Figures 2, 10A:
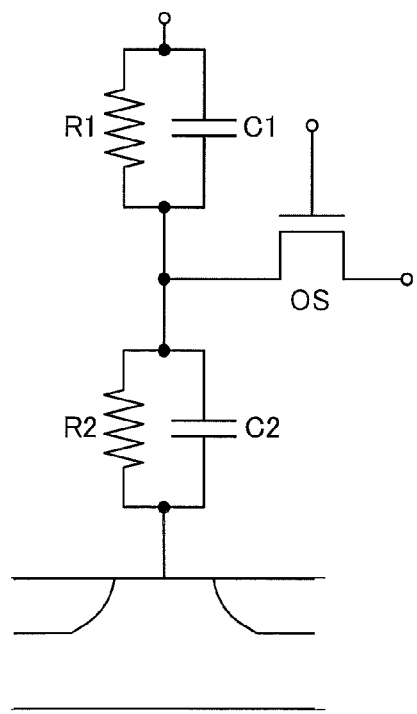

The components such as transistors in the semiconductor device in FIG. 10A-1 can be regarded as including a resistor and a capacitor as shown in FIG. 10A-2. That is, in FIG. 10A-2, the transistor 160 and the capacitor 164 are each regarded as including a resistor and a capacitor. R1 and C1 denote the resistance value and the capacitance value of the capacitor 164, respectively. The resistance value R1 corresponds to the resistance value of an insulating layer included in the capacitor 164. R2 and C2 denote the resistance value and the capacitance value of the transistor 160, respectively. The resistance value R2 corresponds to the resistance value of a gate insulating layer at the time when the transistor 160 is on. The capacitance value C2 corresponds to the capacitance value of so-called gate capacitance (capacitance between the gate electrode and the source electrode or drain electrode and capacitance between the gate electrode and the channel formation region).

A charge holding period (also referred to as a data holding period) is determined mainly by the off-state current of the transistor 162 under the condition where gate leakage of the transistor 162 is sufficiently small, and R1≥ROS and R2≥ROS, where ROS is the resistance (also referred to as effective resistance) between the source electrode and the drain electrode when the transistor 162 is off.

On the other hand, in the case where the above conditions are not satisfied, it is difficult to ensure a sufficient holding period even if the off-state current of the transistor 162 is sufficiently small. This is because leakage current other than the off-state current of the transistor 162 (e.g., leakage current generated between the source electrode and the gate electrode of the transistor 160) would be large. Thus, it can be said that the semiconductor device disclosed in this embodiment desirably satisfies the above relation.

Meanwhile, it is desirable that $C1 \geq C2$. This is because by increasing C1, the potential of the fifth wiring can be effectively applied to the floating gate portion FG when the potential in the floating gate portion FG is controlled by the fifth wiring, and the difference between the potentials applied to the fifth wiring (e.g., a potential of reading and a potential of not reading) can be small.

When the above relations are satisfied, a more preferable semiconductor device can be realized. Note that R1 and R2 depend on the gate insulating layer of the transistor 160 and the insulating layer of the capacitor 164. The same applies to C1 and C2. Therefore, the material, the thickness, and the like of the gate insulating layer are preferably set as appropriate to satisfy the above relations.

In the semiconductor device described in this embodiment, the floating gate portion FG has an effect similar to that of a floating gate of a floating-gate transistor of a flash memory or the like, but the floating gate portion FG of this embodiment has a feature which is essentially different from that of the floating gate of the flash memory or the like. In a flash memory, since voltage applied to a control gate is high, it is necessary to keep a proper distance between cells in order to prevent the potential from affecting a floating gate of the adjacent cell. This is one of the factors inhibiting high integration of the semiconductor device. The factor is due to a basic principle of a flash memory that tunneling current is generated by application of a high electric field.

In contrast, the semiconductor device according to this embodiment is operated by switching of a transistor including an oxide semiconductor and does not use the above principle of charge injection by tunneling current. That is, unlike a flash memory, a high electric field for charge injection is not necessary. Accordingly, an effect of a high electric field for a control gate on an adjacent cell does not need to be taken into account; thus, high integration can be facilitated.

In addition, it is also advantage over a flash memory that a high electric field is unnecessary and a large peripheral circuit (such as a booster circuit) is unnecessary.

For example, the highest voltage applied to the memory cell according to this embodiment (the difference between the highest potential and the lowest potential which are applied to terminals of the memory cell at the same time) can be 5 V or lower, preferably 3 V or lower, in each memory cell in the case where data of two levels (one bit) is written.

In the case where the dielectric constant $\in$r1 of the insulating layer included in the capacitor 164 is different from the dielectric constant $\in$r2 of the insulating layer included in the transistor 160, it is easy to satisfy the relation that $C1 \geq C2$ while $2 \times S2 \geq S1$, (desirably $S2 \geq S1$) where S1 is the area of the insulating layer included in the capacitor 164 and S2 is the area of an insulating layer forming the gate capacitance of the transistor 160. That is, it is easy to satisfy $C1 \geq C2$ while the area of the insulating layer included in the capacitor 164 is small. Specifically, for example, when a film formed of a high-k material such as hafnium oxide or a stack of a film formed of a high-k material such as hafnium oxide and a film formed of an oxide semiconductor is used for the insulating layer included in the capacitor 164, $\in$r1 can be set to 10 or more, preferably 15 or more, and when a film formed of silicon oxide is used for the insulating layer forming the gate capacitance, $\in$r2 can be 3 to 4.

A combination of such structures enables further higher integration of the semiconductor device according to the disclosed invention.

Note that in addition to higher integration, a multilevel technique can be employed in order to increase the storage capacity of the semiconductor device. For example, data of three or more levels is written to one memory cell, whereby the storage capacity can be increased as compared to the case where two-level data is written. The multilevel technique can be achieved by, for example, giving charge Q for applying another potential to the gate electrode of the first transistor, in addition to charge $Q_L$ for applying a low potential and charge $Q_H$ for supplying a high potential. In this case, enough storage capacity can be ensured even when a circuit structure in which $F^2$ (the cell size in terms of the minimum feature size) is not sufficiently small is employed.

Note that an n-channel transistor (an n-type transistor) in which electrons are majority carriers is used in the above description, but it will be appreciated that a p-channel transistor in which holes are majority carriers can be used instead of the n-channel transistor.

As described above, the semiconductor device according to this embodiment is suitable for increasing the degree of integration. According to one embodiment of the disclosed invention, a wiring is shared between a plurality of memory cells and the contact area is reduced; thus, a semiconductor device in which the degree of integration is further increased can be provided.

The structures, the methods, and the like described in this embodiment can be combined as appropriate with any of the structures, the methods, and the like described in the other embodiments.

(Embodiment 4)

In this embodiment, an application example of the semiconductor device described in the above embodiments will be described. Specifically, an example of a semiconductor device in which the semiconductor devices described in the above embodiments are arranged in a matrix will be described.

Figure 11:
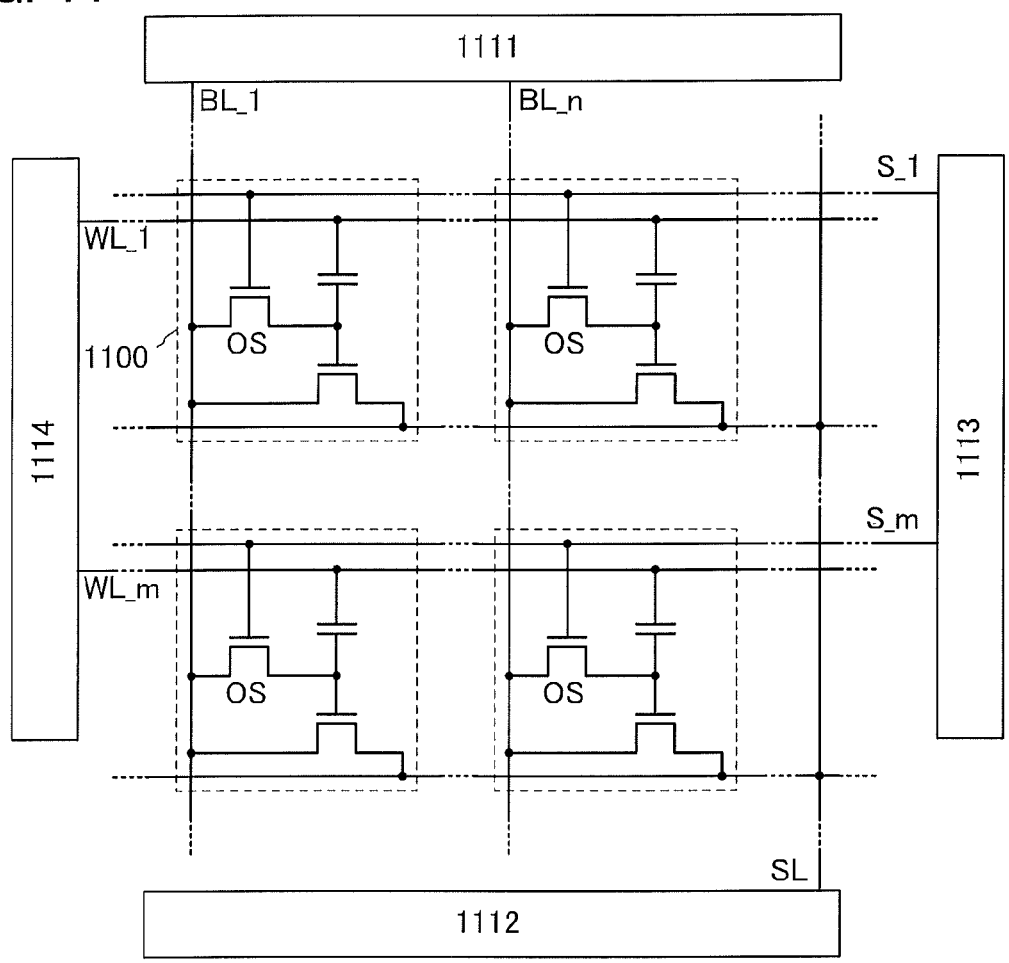
FIG. 11 is a circuit diagram of a semiconductor device.

FIG. 11 is an example of a circuit diagram of a semiconductor device having storage capacity of m×n bits. Note that lines having a similar function are distinguished by "_1", "_2", "_m", "_n", and the like added to the end of their names in FIG. 11.

The semiconductor device according to one embodiment of the present invention includes a memory cell array which includes m (m is an integer of 2 or more) signal lines S, m word lines WL, n (n is an integer of 2 or more) bit lines BL, k (k is a natural number of less than n) source lines SL, and memory cells 1100 arranged in a matrix of in rows (in the vertical direction)×n columns (in the horizontal direction); and peripheral circuits such as a first driver circuit 1111, a second driver circuit 1112, a third driver circuit 1113, and a fourth driver circuit 1114. Here, the structure described in the above embodiment (the structure in FIG. 10A-1) is applied to the memory cell 1100.

Each of the memory cells 1100 includes a first transistor, a second transistor, and a capacitor. In each of the memory cells 1100, a gate electrode of the first transistor, one of a source electrode or a drain electrode of the second transistor, and one of electrodes of the capacitor are electrically connected to one another, and the source line SL and a source electrode (a source region) of the first transistor are electrically connected to each other. In addition, the bit line BL, the other of the source electrode or the drain electrode of the second transistor, and a drain electrode of the first transistor are electrically connected to one another. The word line WL and the other of the electrodes of the capacitor are electrically connected to each other. The signal line S and a gate electrode of the second transistor are electrically connected to each other. In other words, the source line SL corresponds to the first wiring (the 1st line) in the structure illustrated in FIG. 10A-1, the bit line BL corresponds to the second wiring (the 2nd line) and the third wiring (the 3rd line), the signal line S corresponds to the fourth wiring (the 4th line), and the word line WL corresponds to the fifth wiring (the 5th line).

In the memory cell array illustrated in FIG. 11, the bit lines BL, the source line SL, the word lines WL, and the signal lines S form a matrix. To one bit line BL, memory cells 1100 arranged in one column are connected. In addition, n memory cells 1100 arranged in one row are connected to one word line WL and one signal line S. Further, the number of source lines SL is smaller than that of the bit lines BL; therefore, the source line SL needs to be connected to the plurality of memory cells 1100 at least including the memory cells 1100 which are connected to the bit lines BL in different columns. In other words, j (j is an integer greater than or equal to (m+1) and less than or equal to (m×n)) memory cells 1100 are connected to the source line SL. Note that it is preferable that the source line SL be arranged in the proportion of one to plural bit lines BL (i.e., (n/k) is an integer). In that case, if an equal number of the memory cells 1100 is connected to each source line SL, (m×n/k) memory cells 1100 are connected to each source line SL.

As in the memory cell array illustrated in FIG. 11, when the source line SL, which connects one memory cell 1100 to another memory cell 1100, is connected to the plurality of memory cells 1100 at least including the memory cells 1100 which are connected to the bit lines BL in different columns to make the number of source lines SL be smaller than that of bit lines BL, the number of source lines can be made sufficiently small; thus, the degree of integration of the semiconductor device can be increased.

The bit line BL is electrically connected to the first driver circuit 1111. The source line SL is electrically connected to the second driver circuit 1112. The signal line S is electrically connected to the third driver circuit 1113. The word line WL is electrically connected to the fourth driver circuit 1114. Note that here, the first driver circuit 1111, the second driver circuit 1112, the third driver circuit 1113, and the fourth driver circuit 1114 are separately provided; however, the disclosed invention is not limited to this. A driver circuit having any one or some of the functions may alternatively be used.

Figure 12:
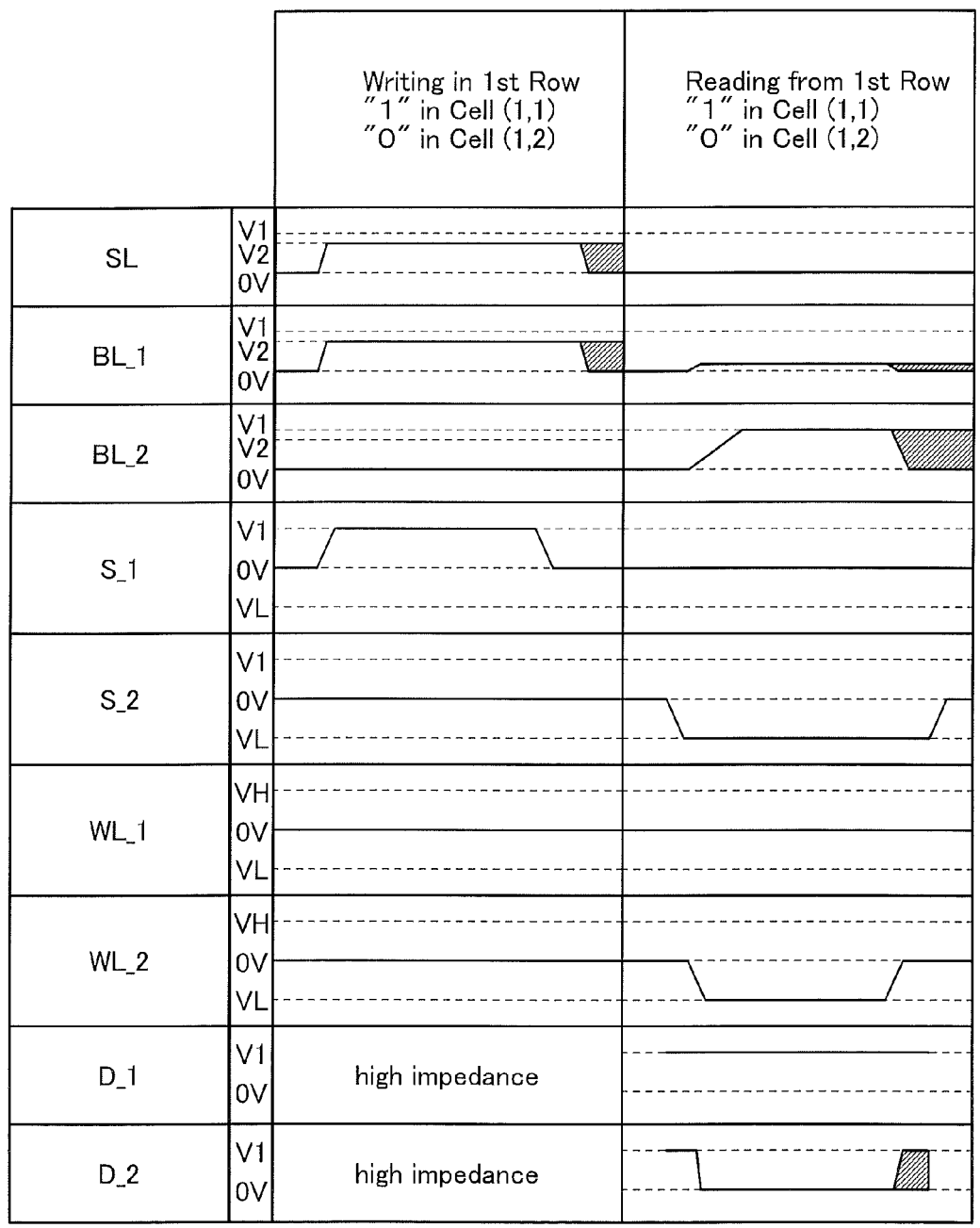
FIG. 12 is a timing chart.

Next, write operation and read operation will be described. FIG. 12 is an example of a timing chart of write operation and read operation of the semiconductor device illustrated in FIG. 11.

Although operation of a semiconductor device including a memory cell array of two rows and two columns will be described for simplification here, the disclosed invention is not limited to this.

Writing data to the memory cell 1100 (1,1) and the memory cell 1100 (1,2), which are in the first row, and reading data from the memory cell 1100 (1,1) and the memory cell 1100 (1,2), which are in the first row, will be described. Note that in the following description, the data to be written to the memory cell (1,1) is "1" and data to be written to the memory cell (1,2) is "0."

Firstly, the write operation will be described. A potential V1 is applied to the signal line S_1 in the first row, whereby the second transistors in the first row are turned on. Further, a potential of 0 V is applied to the signal line S_2 in the second row, whereby the second transistors in the second row are turned off.

Further, a potential V2 is applied to the bit line BL_1 in the first column and the potential of 0 V is applied to the bit line BL_2 in the second column.

Thus, the potential V2 is applied to a floating gate portion FG of the memory cell (1,1), and the potential of 0 V is applied to a floating gate portion FG of the memory cell (1,2). Here, the potential V2 is higher than the threshold value of the first transistor. Then, the potential of the signal line S_1 in the first row is set to 0 V, whereby the second transistors in the first row are turned off to finish writing. It is preferable that the potential V2 be substantially equal to the potential V1 or lower than or equal to the potential V1.

Note that the word line WL_1 in the first row and the word line WL_2 in the second row are at the potential of 0 V during the write operation. At the end of the write operation, before the potential of the bit line BL_1 in the first column is changed, the potential of the signal line S_1 in the first row is set to 0 V. After the write operation, the threshold value of a memory cell is Vw0 in the case where data "0" has been written and Vw1 in the case where data "1" has been written. Here, the threshold value of the memory cell means the voltage of the terminal connected to the word line WL when the resistance state between the source electrode and the drain electrode of the first transistor changes. Note that, here, Vw0>0>Vw1.

Secondly, the read operation will be described. Here, the bit line BL is electrically connected to a read-out circuit illustrated in FIG. 13.

The potential 0 V and the potential VL are applied to the word line WL_1 in the first row and the word line WL_2 in the second row, respectively. The potential VL is lower than the threshold value Vw1. When the word line WL1 is at the potential of 0 V, in the first row, the first transistor of the memory cell in which data "0" is held remains off, and the first transistor of the memory cell in which data "1" is held is turned on. When the word line WL_2 is at the potential VL, in the second row, the first transistors of the memory cells in which either data "0" or data "1" is held are turned off.

As a result, the resistance between the bit line BL_1 and the source line SL is low because the first transistor in the memory cell (1,1) is on, and the resistance between the bit line BL_2 and the source line SL is high because the first transistor in the memory cell (1,2) is off. A read-out circuit connected to the bit line BL_1 and the bit line BL2 can read data utilizing a difference in resistance of the bit line.

Note that, during the read operation, the potential of 0 V and the potential VL are applied to the signal line S_1 and the signal line S_2, respectively, whereby all the second transistors are off. The potential of the floating gate portions FG in the first row is 0 V or V2; thus, all the second transistors can be turned off by setting the potential of the signal line S_1 at 0 V. On the other hand, if the potential VL is applied to the word line WL_2, the potential of the floating gate portions FG in the second row would become lower than the potential right after writing. Therefore, in order to prevent the second transistors from turning on, the signal line S_2 is set to a low potential (the potential VL) which is the same as the potential of the word line WL_2. That is, the potentials of the signal line S and the word line WL in the row where data is not read are set to the same potential (the potential VL). Thus, all the second transistors can be turned off.

Figure 13:
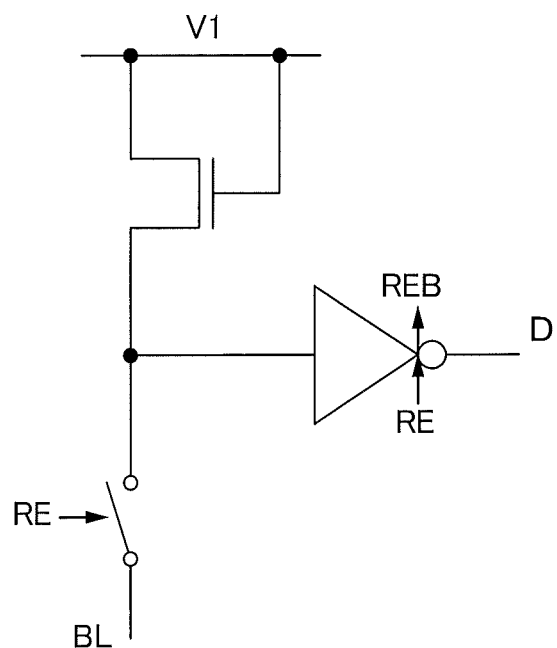
FIG. 13 is a circuit diagram of a semiconductor device.

Next, an output potential in the case where a circuit in FIG. 13 is used as a read-out circuit will be described. In the read-out circuit illustrated in FIG. 13, the bit line BL is connected to a clocked inverter and a transistor which is diode-connected to a wiring to which the potential V1 is applied, through a switch controlled by a read enable signal (a RE signal). Further, a fixed potential (e.g., 0 V) is applied to the source line SL. Since the resistance between the bit line BL_1 and the source line SL is low, a low potential is applied to the clocked inverter and an output D_1 is High. Since the resistance between the bit line BL_2 and the source line SL is high, a high potential is applied to the clocked inverter and the output D_2 is Low.

The operation potentials can be set as follows, for example; V1=2 V, V2=1.5 V, VH=2 V, and VL=−2 V.

Next, write operation which is different from the above write operation will be described. The data to be written is the same as that in the above write operation.

Figure 14:
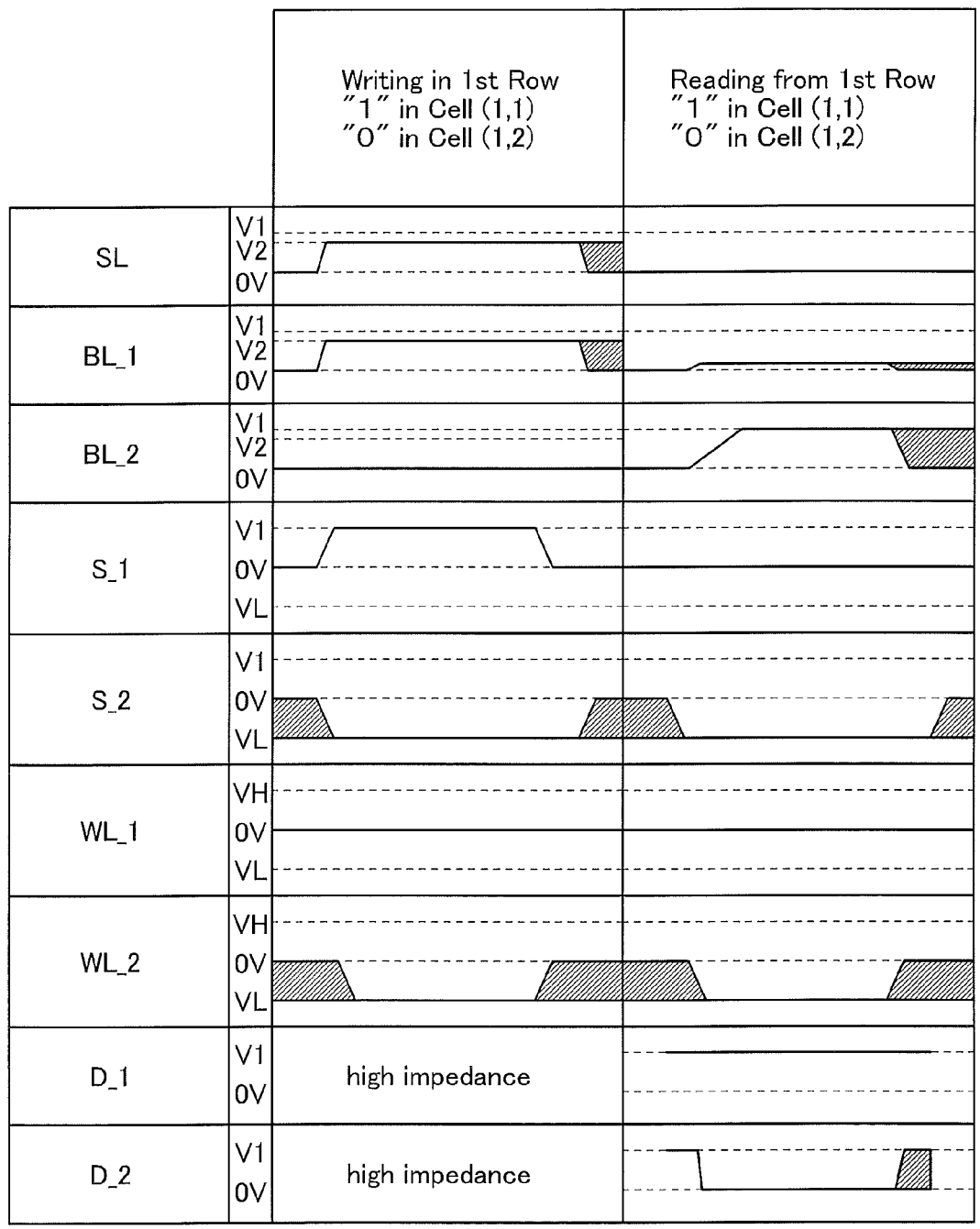
FIG. 14 is a timing chart.

FIG. 14 is an example of a timing chart of the write operation and read operation.

In the write operation based on the timing chart of FIG. 12 (i.e., writing to the first row), the potential of the word line WL_2 at the time of writing is set to a potential of 0 V; thus, for example, in the case where data which has been written to the memory cell (2,1) or the memory cell (2,2) is data "1", steady-state current flows between the bit line BL_1 and the bit line BL_2. This is because at the time of the writing to the first row, the first transistors in the memory cells in the second row are turned on, whereby the bit line BL_1 and the bit line BL_2 are connected at low resistance through the source line. In the write operation illustrated in FIG. 14, such steady-state current is less likely to be generated.

The potential V1 is applied to the signal line S_1 in the first row, whereby the second transistors in the first row are turned on. Further, the potential 0V is applied to the signal line S_2 in the second row, whereby the second transistors in the second row are turned off.

Further, a potential V2 is applied to the bit line BL_1 in the first column and the potential of 0 V is applied to the bit line BL_2 in the second column.

Thus, the potential V2 is applied to the floating gate portion FG of the memory cell (1,1), and the potential of 0 V is applied to the floating gate portion FG of the memory cell (1,2). Here, the potential V2 is higher than the threshold value of the first transistor. Then, the potential of the signal line S_1 in the first row is set to 0 V, whereby the second transistors in the first row are turned off to finish writing.

Note that the word line WL_1 in the first row and the word line WL_2 in the second row are at the potential of 0 V and the potential of VL, respectively, during the write operation. When the word line WL_2 in the second row is at the potential VL, the first transistors of the memory cells in which either data "0" or data "1" is held in the second row are turned off. The potential V2 is applied to the source line SL during the write operation. In the case where data "0" is written to all the memory cells, the potential of 0 V may be applied to the source line.

At the end of the write operation, before the potential of the bit line BL_1 in the first column is changed, the potential of the signal line S_1 in the first row is set to 0 V. After the write operation, the threshold value of a memory cell is Vw0 in the case where data "0" has been written and Vw1 in the case where data "1" has been written. Here, Vw0>0>Vw1 is satisfied.

In the write operation, the first transistors in the memory cells in the row to which data is not written (in this case, the second row) are off. Thus, only the row to which data is written has a problem of steady-state current between the bit line and the source line. In the case where data "0" is written to the memory cell of the row to which data is written, the first transistor in the memory cell is off; thus, a problem of steady-state current does not occur. On the other hand, in the case where data "1" is written to the memory cell of the row to which data is written, the first transistor in the memory cell is on; thus, steady-state current occurs if there is a potential difference between the source line SL and the bit line BL (in this case, the bit line BL_1). Therefore the potential of the source line SL is made to be equal to the potential V2 of the bit line BL_1, whereby steady-state current between the bit line and the source line can be prevented.

As described above, generation of steady-state current at the time of writing can be prevented in the write operation. In other words, power consumed at the time of the write operation can be sufficiently reduced in the write operation.

Note that the read operation is performed in a manner similar to that of the above read operation.

A semiconductor device including an oxide semiconductor whose off-state current is extremely low is used as the semiconductor device in FIG. 11, whereby stored data can be held for an extremely long time. In other words, refresh operation becomes unnecessary or the frequency of the refresh operation can be extremely low, which leads to a sufficient reduction in power consumption. Moreover, stored data can be stored for a long time even when power is not supplied.

Further, the semiconductor device in FIG. 11 does not need high voltage for writing data, and degradation of the element does not become a problem. Thus, the semiconductor device in FIG. 11 does not have a limit on the number of rewriting, which has been a problem of a conventional non-volatile memory, and thus has significantly improved reliability. Furthermore, since data is written by turning on or off the transistor, high-speed operation can be easily realized. Additionally, there is an advantage that operation for erasing data is not needed.

Since a transistor including a material other than an oxide semiconductor can operate at sufficiently high speed, when it is combined with a transistor including an oxide semiconductor, a semiconductor device can perform operation (e.g., reading data) at sufficiently high speed. Further, with a transistor including a material other than an oxide semiconductor, a variety of circuits (e.g., a logic circuit or a driver circuit) which needs to operate at high speed can be suitably realized.

A semiconductor device includes both the transistor including a material other than an oxide semiconductor and the transistor including an oxide semiconductor, whereby the semiconductor device can have novel features.

Furthermore, in the semiconductor device illustrated in FIG. 11, the number of wirings per memory cell can be reduced. Accordingly, the area of memory cells can be reduced and the storage capacity per unit area of the semiconductor device can be increased.

The structures, the methods, and the like described in this embodiment can be combined as appropriate with any of the structures, the methods, and the like described in the other embodiments.

(Embodiment 5)

In this embodiment, the cases where the semiconductor device described in the above embodiments is applied to an electronic device will be described with reference to FIGS. 15A to 15F. In this embodiment, the case where the above semiconductor device is applied to an electronic device such as a computer, a mobile phone (also referred to as a mobile telephone or a mobile telephone device), a portable information terminal (including a portable game console, an audio player, and the like), a digital camera, a digital video camera, an electronic paper, or a television device (also referred to as a television or a television receiver) will be described.

Figure 15A:
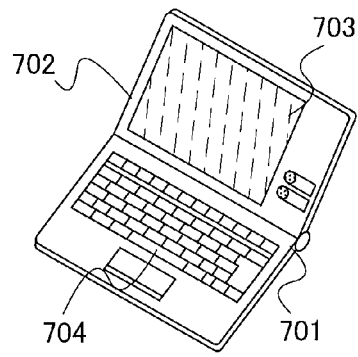
FIGS. 15A to 15F illustrate electronic devices each including a semiconductor device.

FIG. 15A illustrates a notebook personal computer including a housing 701, a housing 702, a display portion 703, a keyboard 704, and the like. At least one of the housing 701 and the housing 702 is provided with the semiconductor device described in the above embodiments. Consequently, a notebook personal computer with sufficiently low power consumption, in which writing and reading of data can be performed at high speed and data can be held for a long time, can be realized.

Figure 15D:
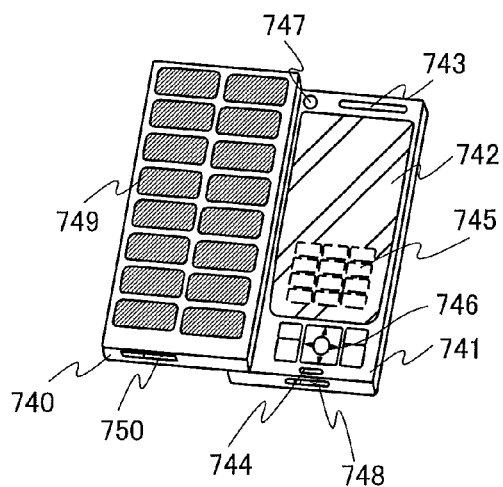
Figure 15B:
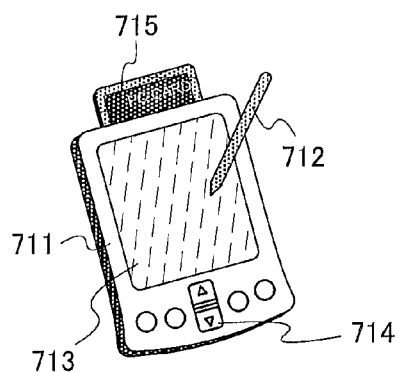

FIG. 15B illustrates a portable information terminal (personal digital assistance (PDA)). A main body 711 is provided with a display portion 713, an external interface 715, operation buttons 714, and the like. Further, a stylus 712 or the like for operating the portable information terminal is also provided. The semiconductor device described in the above embodiments is provided in the main body 711. Consequently, a portable information terminal with sufficiently low power consumption, in which writing and reading of data can be performed at high speed and data can be held for a long time, can be realized.

Figure 15E:
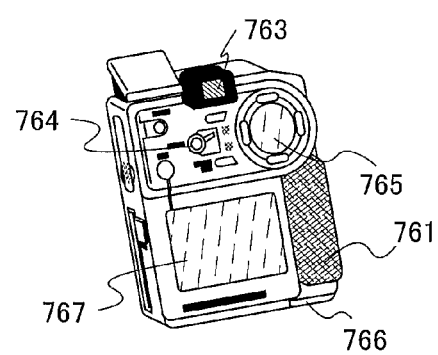
Figure 15C:
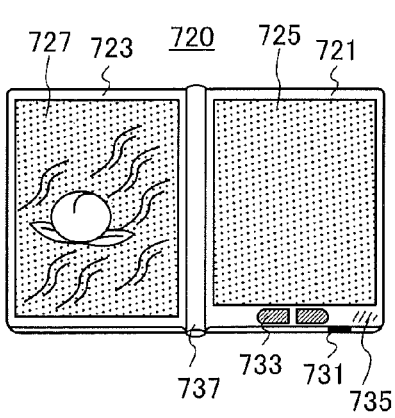

FIG. 15C illustrates an e-book reader 720 mounting an electronic paper. The e-book reader has two housings, a housing 721 and a housing 723. The housing 721 and the housing 723 are provided with a display portion 725 and a display portion 727, respectively. The housing 721 and the housing 723 are connected by a hinge 737 and can be opened and closed along the hinge 737. Further, the housing 721 is provided with a power switch 731, operation keys 733, a speaker 735, and the like. At least one of the housing 721 and the housing 723 is provided with the semiconductor device described in the above embodiments. Consequently, an e-book reader with sufficiently low power consumption, in which writing and reading of data can be performed at high speed and data can be held for a long time, can be realized.

FIG. 15D illustrates a mobile phone including two housings, a housing 740 and a housing 741. Further, the housing 740 and the housing 741 which are in a state where they are opened as illustrated in FIG. 15D can be slid so that one is lapped over the other to make the mobile phone small and suitable for being carried. The housing 741 is provided with a display panel 742, a speaker 743, a microphone 744, an operation key 745, a pointing device 746, a camera lens 747, an external connection terminal 748, and the like. The housing 740 is provided with a solar cell 749 for charging the mobile phone, an external memory slot 750, and the like. In addition, an antenna is incorporated in the housing 741. At least one of the housing 740 and the housing 741 is provided with the semiconductor device described in the above embodiments. Consequently, a mobile phone with sufficiently low power consumption, in which writing and reading of data can be performed at high speed and data can be held for a long time, can be realized.

FIG. 15E illustrates a digital camera including a main body 761, a display portion 767, an eyepiece 763, an operation switch 764, a display portion 765, a battery 766, and the like. The semiconductor device described in the above embodiments is provided in the main body 761. Consequently, a digital camera with sufficiently low power consumption, in which writing and reading of data can be performed at high speed and data can be held for a long time, can be realized.

Figure 15F:
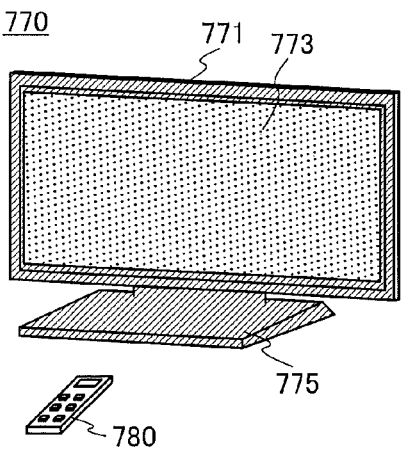

FIG. 15F illustrates a television device 770 including a housing 771, a display portion 773, a stand 775, and the like. The television device 770 can be operated by an operation switch of the housing 771 or a remote control 780. The semiconductor device described in the above embodiments is mounted in the housing 771 and the remote control 780. Consequently, a television device with sufficiently low power consumption, in which writing and reading of data can be performed at high speed and data can be held for a long time, can be realized.

Thus, the semiconductor device according to the above embodiments is mounted in the electronic devices described in this embodiment. Accordingly, electronic devices with low power consumption can be realized.

Example 1

In this example, an off-state current of a transistor including an offset region and an off-state current of a transistor without an offset region, that is, a transistor in which the whole region of a semiconductor layer overlaps with a source electrode, a drain electrode, or a gate electrode are compared.

First, an example of how to calculate an off-state current in this example will be described. In this example, an off-state current was measured by measuring a leakage current of a circuit for characteristic evaluation.

Figure 16:
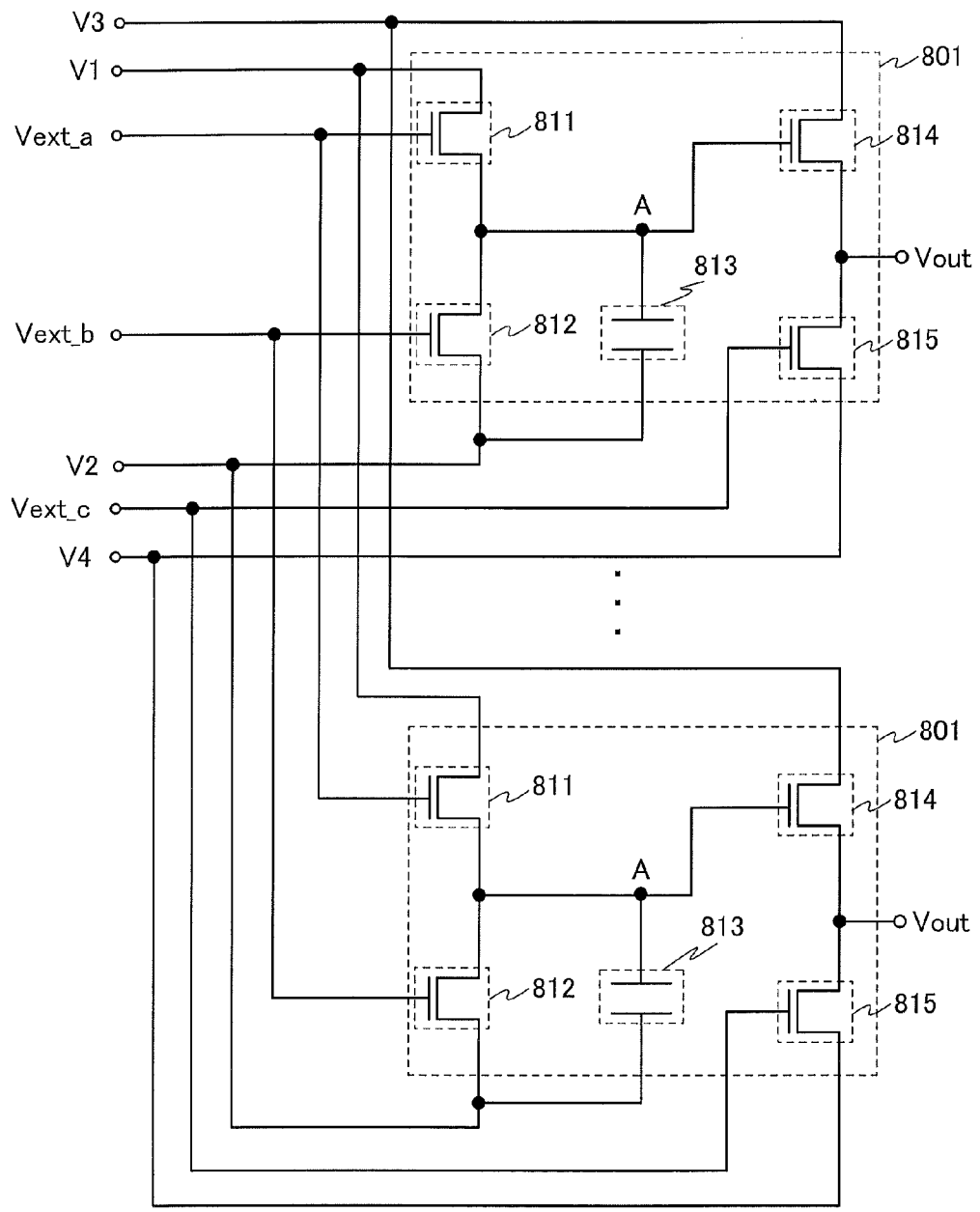
FIG. 16 is a circuit diagram showing a structure of a circuit for characteristic evaluation.

FIG. 16 is a circuit diagram showing a structure of the circuit for characteristic evaluation. The circuit for characteristic evaluation in FIG. 16 includes a plurality of measurement systems 801. The measurement systems 801 are connected in parallel. Here, as an example, eight measurement systems 801 are connected in parallel.

The measurement system 801 includes a transistor 811, a transistor 812, a capacitor 813, a transistor 814, and a transistor 815.

A voltage V1 is input to one of a source and a drain of the transistor 811, and a voltage Vext_a is input to a gate of the transistor 811. The transistor 811 is for injecting charge.

One of a source and a drain of the transistor 812 is connected to the other of the source and the drain of the transistor 811, a voltage V2 is input to the other of the source and the drain of the transistor 812, and a voltage Vext_b is input to a gate of the transistor 812. The transistor 812 is for evaluating leakage current. Note that the leakage current here includes an off-state current of a transistor.

The first electrode of the capacitor 813 is connected to the other of the source and the drain of the transistor 811. To the second electrode of the capacitor 813, a voltage V2 is input. Here, 0 V is input as the voltage V2.

A voltage V3 is input to one of a source and a drain of the transistor 814. A gate of the transistor 814 is connected to the other of the source and the drain of the transistor 811. Note that a portion where the gate of the transistor 814, the other of the source and the drain of the transistor 811, the one of the source and the drain of the transistor 812, and the first electrode of the capacitor 813 are connected to one another is also referred to as a node A.

One of a source and a drain of the transistor 815 is connected to the other of the source and the drain of the transistor 814, a voltage V4 is input to the other of the source and the drain of the transistor 815, and a voltage Vext_c is input to a gate of the transistor 815. Note that here, 0.5 V is input as the voltage Vext_c.

The measurement system 801 outputs a voltage of a portion where the other of the source and the drain of the transistor 814 is connected to the one of the source and the drain of the transistor 815, as an output voltage Vout.

In this example, a transistor having a channel length L of 10 µm and a channel width W of 10 µm and including an oxide semiconductor layer is used as an example of the transistor 811. A transistor having a channel length L of 3 µm and a channel width W of 100 µm and including an oxide semiconductor layer is used as an example of each of the transistor 814 and the transistor 815. A bottom-gate transistor including an oxide semiconductor layer and a source electrode and a drain electrode on and in contact with the oxide semiconductor layer is used as an example of the transistor 812. Further, measurement was performed under four conditions where the transistor 812 has two kinds of transistors, Structure A and Structure B, each with two different channel widths W (see Table 1).

TABLE 1

| | Structure | Channel Length L [μm] | Channel Widht W [μm] |
|---|---|---|---|
| Condition 1 | Structure A | 10 | $1 \times 10^5$ |
| Condition 2 | Structure A | 10 | $1 \times 10^6$ |
| Condition 3 | Structure B | 10 | $1 \times 10^5$ |
| Condition 4 | Structure B | 10 | $1 \times 10^6$ |

Figure 20A:
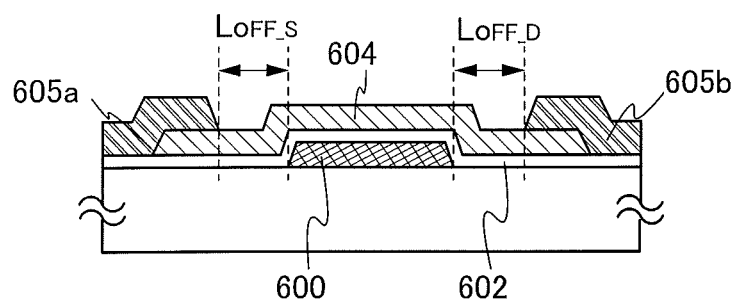
FIGS. 20A and 20B illustrate structures of transistors used in the measurement in Example 1.
Figure 20B:
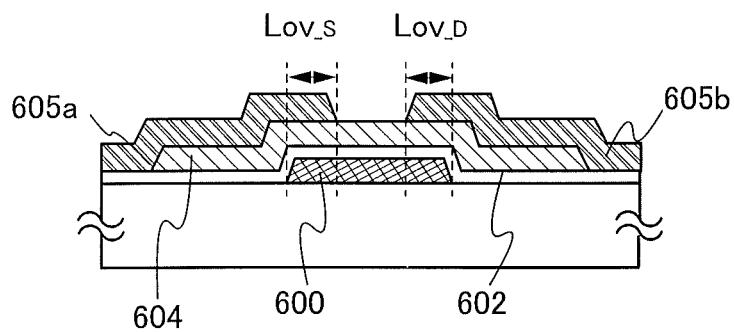

Note that a transistor of Structure A in Table 1 is a bottom-gate transistor in FIG. 20A including a gate electrode 600, an oxide semiconductor layer 604 over the gate electrode 600 with the gate insulating layer 602 interposed therebetween, and the source electrode 605a and the drain electrode 605b over the oxide semiconductor layer 604. The transistor of Structure A is a transistor according to one embodiment of the present invention and includes offset regions ($L_{OFF\_S}$ and $L_{OFF\_D}$) in an oxide semiconductor layer. The offset widths of the $L_{OFF\_S}$ and the $L_{OFF\_D}$ are both 1 μm. In contrast, a transistor of Structure B in Table 1 is a bottom-gate transistor in FIG. 20B including the gate electrode 600, the oxide semiconductor layer 604 over the gate electrode 600 with the gate insulating layer 602 interposed therebetween, and the source electrode 605a and the drain electrode 605b over the oxide semiconductor layer 604. In the transistor of Structure B, the whole region of the oxide semiconductor layer 604 overlaps with the source electrode 605a, the drain electrode 605b, or the gate electrode 600 for the sake of comparison. In addition, in the transistor of Structure B, the oxide semiconductor layer 604 includes a region ($L_{OV\_S}$) which overlaps with the source electrode 605a and the gate electrode 600, and a region ($L_{OV\_D}$) which overlaps with the drain electrode 605b and the gate electrode 600. In the transistor of Structure B, the widths of the $L_{OV\_S}$ and the $L_{OV\_D}$ are both 2 μm.

By separately providing the transistor 811 for injecting charge and the transistor 812 for evaluating leakage current as shown in FIG. 16, the transistor 812 for evaluating leakage current can always be kept off when charge is injected. If the transistor 811 for injecting charge is not provided, the transistor 812 for evaluating leakage current needs to be turned on for injecting charge. In this case, if the transistor 812 for evaluating leakage current is an element that requires a long time to turn into a steady off-state from an on-state, the measurement would take a long time.

In addition, by separately providing the transistor 811 for injecting charge and the transistor 812 for evaluating leakage current, each of these transistors can be of the proper size. Further, by making the channel width W of the transistor 812 for evaluating leakage current larger than that of the transistor 811 for injecting charge, the leakage current other than the leakage current of the transistor 812 for evaluating leakage current can be made relatively small in the circuit for characteristic evaluation. As a result, the leakage current of the transistor 812 for evaluating leakage current can be measured with high accuracy. In addition, the transistor 812 for evaluating leakage current does not need to be turned on when charge is injected; therefore, influence of change in voltage of the node A caused by part of the charge in the channel formation region of the transistor 812 for evaluating leakage current flowing into the node A is prevented.

On the other hand, by making the channel width W of the transistor 811 for injecting charge smaller than that of the transistor 812 for evaluating leakage current, the leakage current of the transistor 811 for injecting charge can be made relatively small. In addition, influence of change in voltage of the node A caused by part of the charge in the channel formation region of the transistor 811 for injecting charge flowing into the node A at the time of switching for injecting change is small.

In addition, by connecting the measurement systems in parallel as shown in FIG. 16, the leakage current of the circuit for characteristic evaluation can be calculated with higher accuracy.

Next, a method for calculating the off-state current of the transistor in this example using the circuit for characteristic evaluation shown in FIG. 16 will be described.

Figure 17:
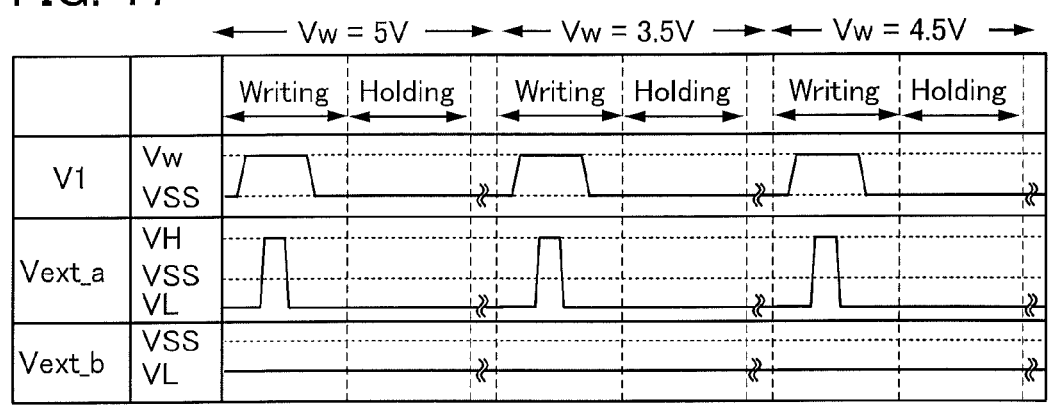
FIG. 17 is a timing chart to describe a method for measuring the leakage current of the circuit for characteristic evaluation shown in FIG. 16.

First, a method for measuring the leakage current of the circuit for characteristic evaluation shown in FIG. 16 will be described with referent to FIG. 17. FIG. 17 is a timing chart for showing a method for measuring the leakage current of the circuit for characteristic evaluation shown in FIG. 16.

In the method for measuring the leakage current using the circuit for characteristic evaluation shown in FIG. 16, a write period and a hold period are provided. The operation in each period will be described below.

First, in a write period, a voltage VL (−3 V) that turns off the transistor 812 is input as the voltage Vext_b. Further, a write voltage Vw is input as the voltage V1, and then a voltage VH (5 V) that keeps the transistor 811 on for a predetermined period is input as the voltage Vext_a. Consequently, charge is accumulated on the node A, and the voltage of the node A thus becomes equivalent to the write voltage Vw. Then, the voltage VL that turns off the transistor 811 is input as the voltage Vext_a. Then, a voltage VSS (0 V) is input as the voltage V1.

Then, in a hold period, the output voltage Vout is measured. The potential of the node A can be obtained by measuring Vout. From the amount of change in the voltage of the node A, change in the amount of charge which the node A holds can be obtained and the leakage current of the transistor 812 can be calculated. As described above, charge can be accumulated on the node A, and the amount of change in the voltage of the node A can be measured.

In general, the voltage $V_A$ of the node A is expressed by Formula 1 as a function of the output voltage Vout.

[Formula 1]

$$V_A = F(Vout) \quad (1)$$

In addition, the charge $Q_A$ of the node A is expressed by Formula 2 using the voltage $V_A$ of the node A, capacitance $C_A$ connected to the node A, and a constant (const). Here, capacitance $C_A$ connected to the node A is the sum of the capacitance of the capacitor 813 and the capacitance other than that of the capacitor 813.

[Formula 2]

$$Q_A = C_A V_A + \text{const} \quad (2)$$

Current $I_A$ of the node A is a time derivative of charge which flows into the node A (or charge which flows out of the node A), and is thus expressed by Formula 3.

[Formula 3]

$$I_A \equiv \frac{\Delta Q_A}{\Delta t} = \frac{C_A \cdot \Delta F(Vout)}{\Delta t} \quad (3)$$

Note that here, as an example, Δt is about 54000 sec. The current $I_A$ of the node A which is leakage current can be obtained from the capacitance $C_A$ connected to the node A and the output voltage Vout in this manner; thus, the leakage current of the circuit for characteristic evaluation can be obtained.

Next, measurement results of the output voltage obtained by the measurement method using the circuit for characteristic evaluation, and the leakage current of the circuit for characteristic evaluation calculated from the measurement results will be shown.

In the measurement, charge was accumulated in the node A and the amount of change in the voltage of the node A was measured (this operation is also referred to as accumulation and measurement operation) repeatedly. Firstly, a first accumulation and measurement operation was repeated 15 times. In the first accumulation and measurement operation, a voltage of 5 V was input as the write voltage Vw in a write period, and held for an hour in a hold period. Secondly, a second accumulation and measurement operation were repeated twice. In the second accumulation and measurement operation, a voltage of 3.5 V was input as the write voltage Vw in a write period, and held for 50 hours in a hold period. Thirdly, a third accumulation and measurement operation was performed once. In the third accumulation and measurement operation, a voltage of 4.5 V was input as the write voltage Vw in a write period, and held for 10 hours in a hold period. By repeating the accumulation and measurement operations, it was confirmed that the measured current values were the values in the steady state. Thus, it is possible to remove a transient current (a current decreasing with time after the start of the measurement) from the current $I_A$ of the node A. As a result, leakage current can be measured with higher accuracy.

Figure 18:
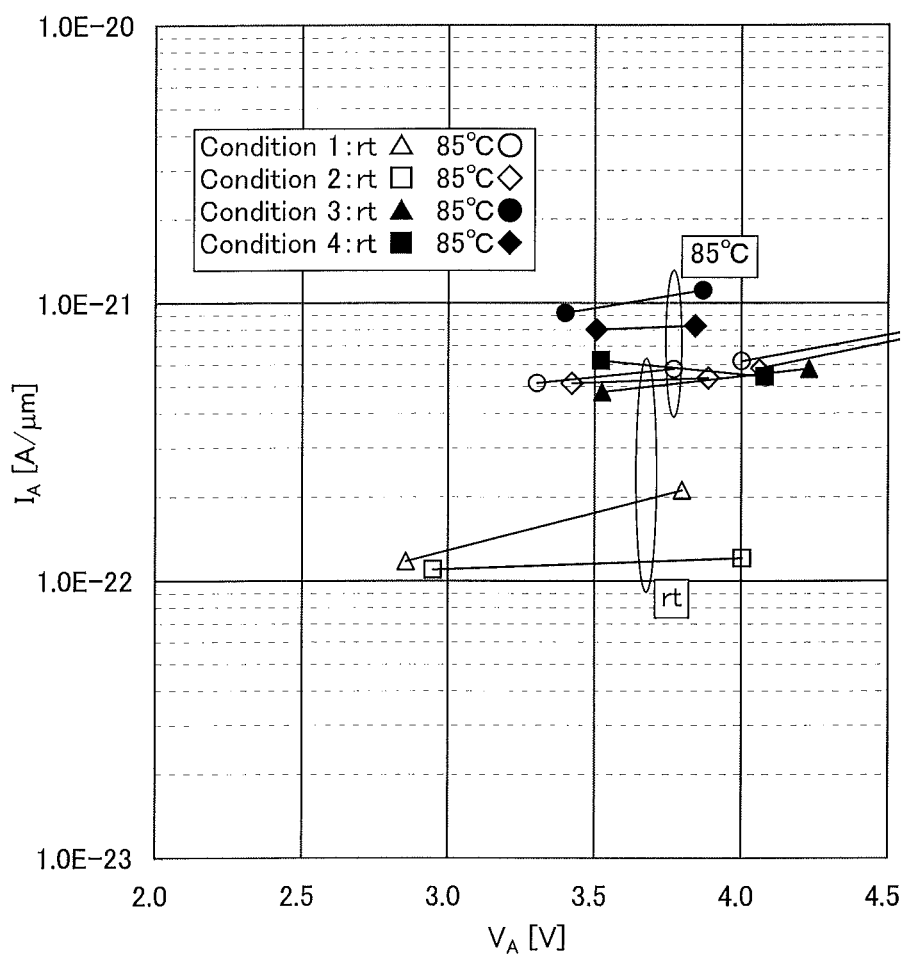
FIG. 18 is a graph showing a relation of a voltage of a node A and leakage current which was estimated by measurement.

FIG. 18 shows relations of the voltage of the node A and the leakage current estimated using the result from the above measurement under the conditions 1 to 4 at room temperature (25° C.) and at 85° C. As is seen in FIG. 18, the leakage current of the transistor of Structure A with offset regions is smaller than that of the transistor of Structure B without an offset region both at room temperature and at 85° C. Further, even at 85° C., the leakage current of the transistor of Structure A was equal to or less than 1 zA/μm.

Since, as described above, the leakage current is sufficiently small in the circuit for characteristic evaluation which includes a transistor including a purified oxide semiconductor layer serving as a channel formation layer, it is understood that the off-state current of a transistor including an offset region is sufficiently small. In addition, it is understood that the off-state current of such a transistor is sufficiently small even when the temperature rises. By using such a transistor in a semiconductor device, a highly reliable semiconductor device can be manufactured.

Note that although the effect of the offset region on leakage current of the transistors is discussed in this example using bottom-gate transistors, the offset region is similarly effective in a top-gate transistor. Note that the off-state current of the top-gate transistor can also be reduced.

Example 2

In this example, the off-state current values of the top-gate transistor having offset regions, which are obtained by calculation, are given.

The structure of the transistor used in the calculation in this example is similar to that of the transistor 362 described in Embodiment 2; the transistor includes an oxide semiconductor layer, a source electrode and a drain electrode over the oxide semiconductor layer, a gate insulating layer covering the oxide semiconductor layer, the source electrode, and the drain electrode, and a gate electrode which overlaps with the oxide semiconductor layer with the gate insulating layer interposed therebetween.

The calculation in this example was performed under the following assumption: the oxide semiconductor layer was intrinsic and the thickness thereof was 30 nm, the band gap (Eg) thereof was 3.15 eV, the electron affinity (χ) thereof was 4.3 eV, the dielectric constant thereof was 15, and the electron mobility thereof was 10 cm$^2$/Vs; the gate insulating layer was formed of silicon oxide and the dielectric constant thereof was 4.1; the source electrode and the drain electrode was formed of titanium nitride and the work function thereof was 3.9 eV; and the gate electrode was formed of tungsten and the work function thereof was 4.9 eV. A device simulation tool Sentaurus Device manufactured by Synopsys. Inc was used for the calculation. SRH recombination model and Auger recombination model were used as the recombination model.

In this example, the calculation was performed under four conditions varying in thickness of the gate insulating layer and channel length L. The conditions of the calculation are given in Table 2 below.

TABLE 2

|  | Thickness of Gate Insulating Layer [nm] | Channel Length L [μm] | Channel Width W [μm] |
| --- | --- | --- | --- |
| Condition 1 | 100 | 10 | 1 × 10$^6$ |
| Condition 2 | 100 | 3 | 1 × 10$^6$ |
| Condition 3 | 10 | 1 | 1 × 10$^6$ |
| Condition 4 | 10 | 0.3 | 1 × 10$^6$ |

Note that the same offset width of the $L_{OFF\_S}$ and the $L_{OFF\_D}$ was employed among the conditions. The offset widths were given in the range of 0.1 μm to 2 μm. Further, for the sake of comparison, the calculation was performed on a transistor with a similar structure in which the offset width is 0 nm and the $L_{OV\_S}$ and the $L_{OV\_D}$ are both 2 μm.

Figure 19A:
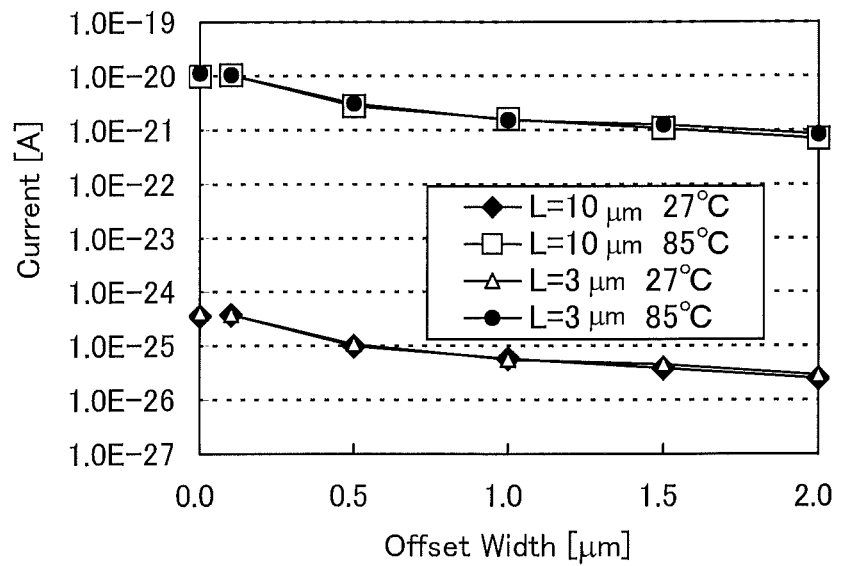
FIGS. 19A and 19B are graphs each showing a relation between an offset width and an off-state current which was estimated by calculation.
Figure 19B:
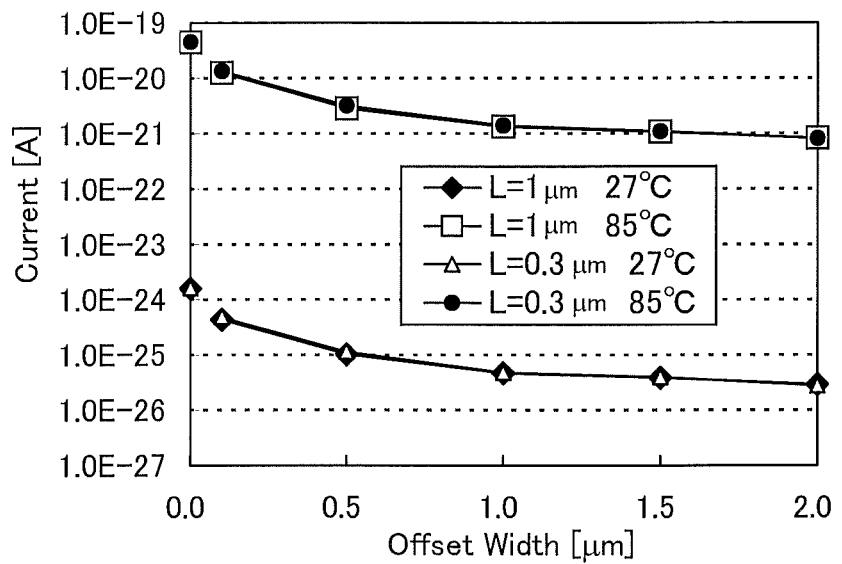

FIG. 19A shows the relation between the offset width and the off-state current in the case where the thickness of the gate insulating layer is 100 nm. The relation was estimated by calculation. FIG. 19B shows the relation between the offset width and the off-state current in the case where the thickness of the gate insulating layer is 10 nm. The relation was estimated by calculation. FIGS. 19A and 19B show values of the off-state current obtained by calculation of the case where a drain voltage (Vds) is 3 V and a gate voltage (Vgs) is −5 V.

According to FIGS. 19A and 19B, leakage current of the transistor with offset regions is smaller than that of the transistor in which the offset width is 0 nm. Further, it was confirmed that the value of the off-state current of the transistor with offset regions is sufficiently small even at 85° C.

In addition, according to FIGS. 19A and 19B, it is shown that the off-state current can be reduced by provision of offset regions, without depending on the channel length L of the transistor. The offset width needs to be greater than 0 nm and is preferably equal to or greater than 0.5 μm and equal to or less than 2 μm.

As described above, it is understood that the off-state current of a transistor including a purified oxide semiconductor layer and an offset region is sufficiently small. In addition, it is understood that the off-state current of such a transistor is sufficiently small even when the temperature rises. By using such a transistor in a semiconductor device, a highly reliable semiconductor device can be manufactured.

This application is based on Japanese Patent Application serial no. 2010-112260 filed with Japan Patent Office on May 14, 2010, the entire contents of which are hereby incorporated by reference.

The invention claimed is:

1. A semiconductor device comprising:
a plurality of memory cells each comprising a first transistor, a second transistor, and a capacitor,
the first transistor comprising:
a first channel formation region;
a first insulating layer over the first channel formation region;
a first gate electrode over the first channel formation region with the first insulating layer interposed therebetween; and
a first electrode and a second electrode which are electrically connected to the first channel formation region,
the second transistor comprising:
an oxide semiconductor layer comprising a second channel formation region and an offset region in contact with the second channel formation region;
a third electrode and a fourth electrode which are electrically connected to the oxide semiconductor layer;
a second insulating layer over the oxide semiconductor layer, the third electrode, and the fourth electrode; and
a second gate electrode over the second channel formation region with the second insulating layer interposed therebetween, and
wherein the first gate electrode, the third electrode, and one electrode of the capacitor are electrically connected to one another.

2. The semiconductor device according to claim 1, wherein the offset region is a region which overlaps with neither the second gate electrode, the third electrode, nor the fourth electrode.

3. The semiconductor device according to claim 1, wherein the first channel formation region comprises silicon.

4. The semiconductor device according to claim 1, further comprising a third gate electrode over the second insulating layer.

5. The semiconductor device according to claim 4, further comprising a fifth electrode between the second gate electrode and the third gate electrode, wherein the fifth electrode electrically connected to the oxide semiconductor layer.

6. The semiconductor device according to claim 1,
wherein the oxide semiconductor layer comprises a first offset region and a second offset region,
wherein the first offset region is provided between the second gate electrode and the third electrode, and
wherein the second offset region is provided between the second gate electrode and the fourth electrode.

7. The semiconductor device according to claim 1, wherein the second gate electrode overlaps with neither the third electrode nor the fourth electrode.

8. The semiconductor device according to claim 1, wherein the third electrode and the fourth electrode are in contact with an upper surface of the oxide semiconductor layer.

9. The semiconductor device according to claim 1, wherein the third electrode and the fourth electrode are in contact with a lower surface of the oxide semiconductor layer.

10. The semiconductor device according to claim 1, wherein the first electrode and the fourth electrode are electrically connected to each other.

11. A semiconductor device comprising:
an oxide semiconductor layer comprising a channel formation region and an offset region adjacent to the channel formation region;
a first electrode and a second electrode which are electrically connected to the oxide semiconductor layer;
an insulating layer over the oxide semiconductor layer, the first electrode, and the second electrode;
a first gate electrode over the channel formation region with the insulating layer interposed therebetween; and
a third electrode over the first electrode with the insulating layer interposed therebetween,
wherein the first electrode and the second electrode overlap with the oxide semiconductor layer.

12. The semiconductor device according to claim 11, wherein the offset region is a region which overlaps with neither the first gate electrode, the first electrode, nor the second electrode.

13. The semiconductor device according to claim 11,
wherein the oxide semiconductor layer comprises a first offset region and a second offset region,
wherein the first offset region is provided between the first gate electrode and the first electrode, and
wherein the second offset region is provided between the first gate electrode and the second electrode.

14. The semiconductor device according to claim 11, wherein the first gate electrode overlaps with neither the first electrode nor the second electrode.

15. The semiconductor device according to claim 11, wherein the first electrode and the second electrode are in contact with an upper surface of the oxide semiconductor layer.

16. A semiconductor device comprising:
a first transistor comprising:
a first channel formation region;
a first insulating layer over the first channel formation region;
a first gate electrode over the first channel formation region with the first insulating layer interposed therebetween; and
a first electrode and a second electrode electrically connected to the first channel formation region,
a second transistor comprising:
an oxide semiconductor layer comprising a second channel formation region and an offset region adjacent to the second channel formation region;
a third electrode and a fourth electrode which are electrically connected to the oxide semiconductor layer;
a second insulating layer over the oxide semiconductor layer, the third electrode, and the fourth electrode; and
a second gate electrode over the second channel formation region with the second insulating layer interposed therebetween,
wherein the first gate electrode and the third electrode are electrically connected to each other.

17. The semiconductor device according to claim 16, wherein the offset region is a region which overlaps with neither the second gate electrode, the third electrode, nor the fourth electrode.

18. The semiconductor device according to claim 16, wherein the first channel formation region comprises silicon.

19. The semiconductor device according to claim 16, further comprising a third gate electrode over the second insulating layer.

20. The semiconductor device according to claim 19, further comprising a fifth electrode between the second gate electrode and the third gate electrode, wherein the fifth electrode electrically connected to the oxide semiconductor layer.

21. The semiconductor device according to claim 16, wherein the oxide semiconductor layer comprises a first offset region and a second offset region,
wherein the first offset region is provided between the second gate electrode and the third electrode, and
wherein the second offset region is provided between the second gate electrode and the fourth electrode.

22. The semiconductor device according to claim 16, wherein the second gate electrode overlaps with neither the third electrode nor the fourth electrode.

23. The semiconductor device according to claim 16, further comprising a fifth electrode over the third electrode with the second insulating layer interposed therebetween.

24. The semiconductor device according to claim 16, wherein the third electrode and the fourth electrode are in contact with an upper surface of the oxide semiconductor layer.

25. The semiconductor device according to claim 16, wherein the third electrode and the fourth electrode are in contact with a lower surface of the oxide semiconductor layer.

26. The semiconductor device according to claim 16, wherein the first electrode and the fourth electrode are electrically connected to each other.

* * * * *

UNITED STATES PATENT AND TRADEMARK OFFICE
CERTIFICATE OF CORRECTION

PATENT NO. : 8,809,851 B2  
APPLICATION NO. : 13/101644  
DATED : August 19, 2014  
INVENTOR(S) : Shunpei Yamazaki et al.

It is certified that error appears in the above-identified patent and that said Letters Patent is hereby corrected as shown below:

In the Specification

Column 9, line 37 – after "of" insert --,--;

Column 12, line 60 – replace "Zn-Mg-0-based" with --Zn-Mg-O-based--;

Column 13, line 15 – replace "Mean" with --M can--;

Column 17, line 54 – replace "58" with --5B--;

Column 25, line 26 – after "$V_{th\_H}$" insert --in--;

Column 26, line 34 – after "transistor" replace ";" with --,--;

Column 28, line 50 – replace "in" with --m--; and

Column 29, line 12 – before "memory" insert --m--.

Signed and Sealed this  
Twenty-sixth Day of May, 2015

Michelle K. Lee  
*Director of the United States Patent and Trademark Office*